United States Patent [19]
Nogle et al.

[11] Patent Number: 5,140,191
[45] Date of Patent: Aug. 18, 1992

[54] LOW DI/DT BICMOS OUTPUT BUFFER WITH IMPROVED SPEED

[75] Inventors: Scott G. Nogle; Perry H. Pelley, III, both of Austin, Tex.

[73] Assignee: Motorola, Inc., Schaumburg, Ill.

[21] Appl. No.: 610,172

[22] Filed: Nov. 5, 1990

[51] Int. Cl.⁵ .................. H03K 19/092; H03K 17/16
[52] U.S. Cl. .................. 307/475; 307/443; 307/296.8; 307/270
[58] Field of Search .............. 307/475, 296.8, 443, 307/296.6, 270, 263, 264, 246, 446

[56] References Cited

U.S. PATENT DOCUMENTS

| | | | |
|---|---|---|---|
| 4,477,740 | 10/1989 | Takeda | 307/475 |
| 4,758,743 | 7/1988 | Dehganpour et al. | 307/443 |
| 4,800,298 | 1/1989 | Yu et al. | 307/443 |
| 4,835,416 | 5/1989 | Miller | 307/296.4 |
| 4,866,674 | 9/1989 | Tran | 365/189 |
| 4,880,997 | 11/1989 | Steele | 307/443 |
| 4,908,794 | 3/1990 | Yamaguchi | 365/189.08 |
| 4,926,069 | 5/1990 | Yamazaki | 307/446 |
| 4,958,086 | 9/1990 | Wang et al. | 307/296.8 |

OTHER PUBLICATIONS

Tran et al., "An 8ns BiCMOS 1Mb ECL SRAM with a Configurable Memory Array Size", 1989, IEEE Solid State Circuits Conf., pp. 36-37.
Kertis et al., "A 12ns 256K BiCMOS SRAM", 1989 IEEE Solid State Circuits Conference, pp. 186-218.
Burnett and Hu, "Hot-Carrier Degradation in Bipolar Transistors at 300 and 110K-Effect on BiCMOS Inverter Performance", IEEE Transactions on Electron Devices, vol. 37, #4, Apr. 1990, pp. 1171-1173.
Gabara and Thompson, "Ground Bounce Control in CMOS Integrated Circuits", IEEE International Solid State Circuits Conf., Feb. 1988, pp. 88-89.
"A 25ns Full-CMOS 1Mb SRAM", IEEE International Solid State Circuits Conference, Feb. 1988, pp. 178-179, List et al.

Primary Examiner—Edward P. Westin
Assistant Examiner—Richard Roseen
Attorney, Agent, or Firm—Paul J. Polansky

[57] ABSTRACT

An output buffer for a device such as a memory comprises a voltage regulator, a current source portion, a switching portion, and an output portion. The voltage regulator provides a constant voltage independent of fluctuations between first and second power supply voltages. The current source portion provides first and second currents to first and second nodes to limit the rate at which transistors in the output portion become conductive. The switching portion provides voltage signals on the first and second nodes respectively in response to positive and negative voltage differences between first and second input voltages. The output portion provides an output signal at either a logic high or a logic low voltage respectively in resonse to the voltage signals at the first and second nodes. The current source portion allows the use of faster bipolar transistors to improve the speed of the output buffer while maintaining accepable di/dt.

22 Claims, 9 Drawing Sheets

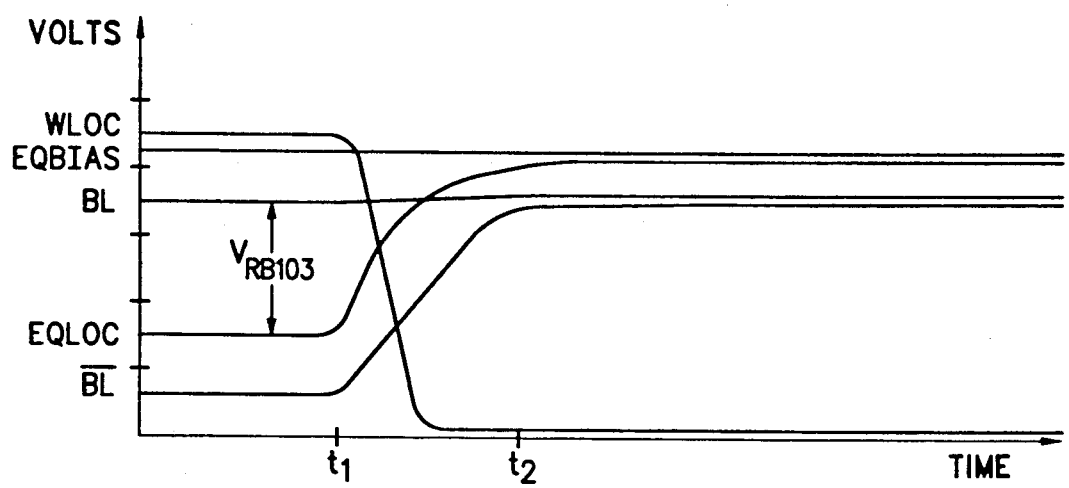
*FIG.5*
*FIG.6*
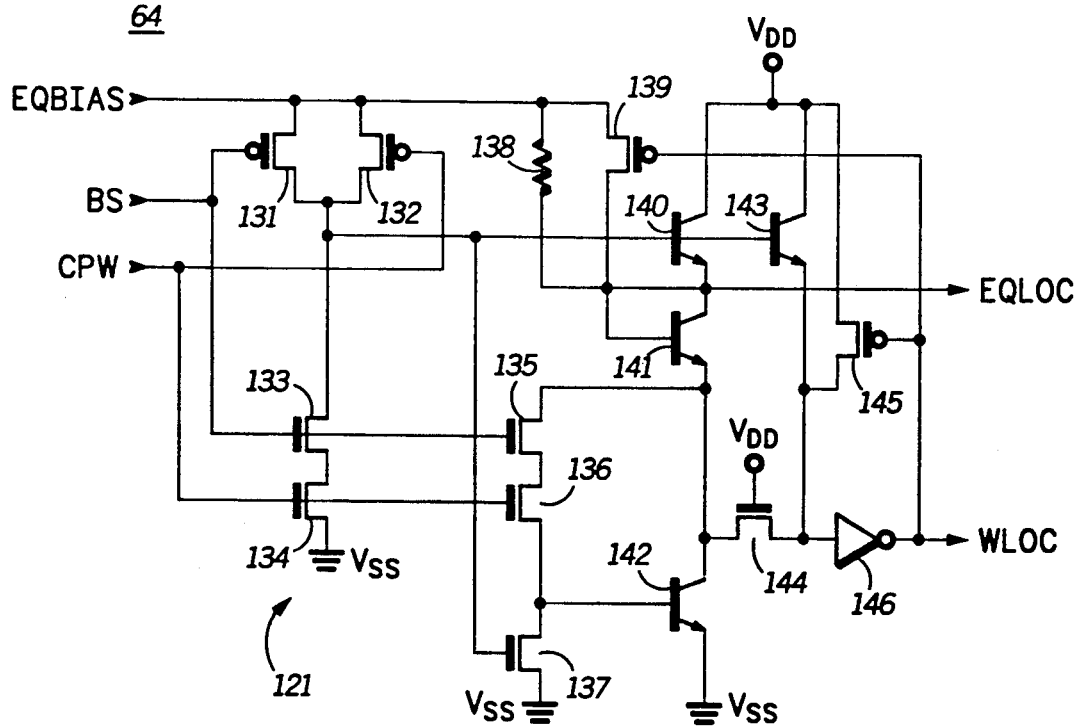

LOW DI/DT BICMOS OUTPUT BUFFER WITH IMPROVED SPEED

CROSS-REFERENCE TO RELATED, COPENDING APPLICATION

Related copending application is application Ser. No. 07/590,980, filed Oct. 1, 1990, by Scott G. Nogle and assigned to the assignee hereof and entitled "A Memory with a Combined Global Data Line Load and Multiplexer".

1. Field of the Invention

This invention relates generally to buffers, and more particularly, to high-speed output buffers for switching large capacitive loads.

2. Background of the Invention

In integrated circuits, there is generally a piece of silicon known as a die or chip which contains electrical circuits and which is connected to a lead frame. The chip has bonding pads which are connected to the lead frame by tiny wires. The lead frame has leads which are used for connecting to a printed circuit board as part of a larger system. The leads of the lead frame have a certain amount of inductance as well as capacitance and resistance. There is also some inductance in the wire connecting the bonding pad to the lead frame. The wire inductance, however, is significantly less than that of the lead frame. The connection of a lead of the lead frame to a circuit board also adds some inductance. As the switching speeds of integrated circuits have increased, this cumulative inductance has begun to have an impact on the performance of the integrated circuit.

Of course it is desirable to have integrated circuits which are very fast. The increased switching speed has also increased the rate at which current changes. This increased rate of current change causes a voltage drop across the inductance. The voltage across an inductance is equal to the inductance times the time rate of change of the current through that inductance. This is expressed as Ldi/dt, where L is the inductance and di/dt is the time rate of change of the current. As the di/dt becomes larger, the voltage across the inductance becomes larger. This voltage drop across an inductance causes a voltage differential between the lead location on the circuit board and the bonding pad to which it is connected on the integrated circuit. This can create a problem of having the internal supply at a different voltage than the voltage of the external supply. This problem can cause the internal supply voltages to differ by so much from their external levels that signals input to the chip are recognized incorrectly.

Several known output buffer circuits provide di/dt control along with fast speed. In recent years, integrated circuit fabrication techniques have provided the ability to manufacture both MOS transistors and bipolar transistors on a single integrated circuit. The use of bipolar transistors improves the speed of output buffers because bipolar transistors generally switch faster than MOS transistors. However, the use of bipolar transistors creates additional problems. One problem is that the increased rate of switching of output buffers with bipolar transistors has worsened the di/dt problem. New circuits are required to take advantage of the improved switching speed of bipolar transistors while maintaining acceptable levels for di/dt. A second problem results from the fact that bipolar transistors degrade in the reverse biased condition and as reverse bias increases, the amount of degradation increases. Therefore using bipolar transistors is subject to reliability problems in that the transistors may degrade over time, ultimately resulting in a failure of the entire integrated circuit.

A third problem arises from the nature of a bipolar transistor itself. In the bipolar transistor, a junction capacitance exists between the P and N areas of silicon. The junction capacitance arises from the minority charge-storing capacity of a PN junction. For example, an NPN transistor has a base-emitter capacitance at the PN base-emitter junction. Minority (N-type) carriers are stored in the P-type base near the junction, and minority (P-type) carriers are stored in the N-type emitter near the junction. The capacitance, sometimes referred to as the diffusion capacitance, represents the ability of the P-type base and the N-type emitter to store minority charge near the junction. The capacitance is determined in part by the bias on the PN junction, and as the forward bias increases, the capacitance also increases.

In some circumstances, the base-emitter capacitance can be significant enough to affect circuit performance. In a circuit using a bipolar transistor as an emitter follower, the base-emitter capacitance can affect the output voltage on the emitter after the base voltage changes. In the emitter follower configuration, when the voltage on the base increases, the voltage on the emitter follows, rising by the same amount. The expected voltage on the emitter is equal to the voltage on the base, minus one base-to-emitter diode voltage drop ($V_{BE}$). However under certain circumstances, the voltage on the base may be self-boosted by the effect of the base-emitter capacitance. When the voltage applied to the base rises quickly, and the load connected to the emitter is highly capacitive, a large base-to-emitter voltage can develop. Then as the voltage on the emitter rises, a bootstrap effect increases the base voltage due to the base-emitter capacitance. If the loading is sufficiently capacitive, then the voltage on the base rises beyond the voltage applied. Eventually, the voltage on the emitter follows the voltage on the base minus $V_{BE}$. If there is no path to discharge the base-emitter capacitor, the voltage on the emitter remains above the desired voltage level. For some circuit applications, such as output buffers, the possibility that the output voltage will self-boost beyond the desired value is harmful to operation of the circuit.

SUMMARY OF THE INVENTION

Accordingly, there is provided, in one form, an output buffer comprising a voltage regulator, current source means, switching means, and output means. The voltage regulator is coupled to first and second power supply voltage terminals, and provides a regulated voltage characterized as having a constant voltage substantially independent of fluctuations in voltage between the first power supply voltage terminal and the second power supply voltage terminal. The current source means is coupled to the voltage regulator, and provides first and second currents from the voltage regulator respectively to first and second nodes. The switching means is coupled to the current source means, and provides voltage signals at the first and second nodes respectively in response to positive and negative voltage differences between first and second input voltages. The output means is coupled to the first and second nodes, and provides an output signal at a logic high voltage in response to the voltage signal at the first node, and provides the output signal at a logic low voltage in response to the voltage signal at the second node.

These and other objects, features and advantages will be more clearly understood from the following detailed description taken in conjunction with the accompanying drawings.

BRIEF DESCRIPTION OF THE DRAWINGS

FIG. 5 illustrates a timing diagram of signals pertinent to FIG. 4;

FIG. 6 illustrates in partial schematic form the bit line load control circuit of FIG. 3 for use with the bit line load of FIG. 4;

DETAILED DESCRIPTION OF THE INVENTION

Figure 1:
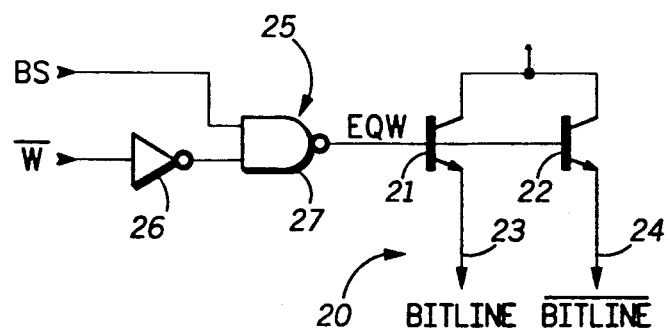
FIG. 1 illustrates in partial schematic form a bit line load in accordance with the prior art and a control circuit therefor.

FIG. 1 illustrates in partial schematic form a bit line load 20 in accordance with the prior art, and control circuit 25 therefor. See, for example, "Bitline Pull-Up Circuit for a BICMOS Read/Write Memory" by Tran in U.S. Pat. No. 4,866,674, issued Sep. 12, 1989; Kertis et. al., "A 12 ns 256K BiCMOS SRAM", in 1989 *IEEE Solid State Circuits Conference*, p. 187. Bit line load 20 comprises an NPN transistor 21 having a collector connected to a positive power supply voltage terminal labelled "$V_{DD}$", a base for receiving a signal labelled "EQW", and an emitter coupled to a bit line 23 having a signal labelled "BITLINE" thereon; and an NPN transistor 22 having a collector connected to $V_{DD}$, a base for receiving signal EQW, and an emitter coupled to a bit line 24 having a signal labelled "$\overline{\text{BITLINE}}$" thereon. Control circuit 25 comprises an inverter 26 having an input terminal for receiving a write signal labelled "$\overline{W}$", and an output terminal; and a NAND gate 27 having a first input terminal for receiving a block select signal labelled "BS", a second input terminal connected to the output terminal of inverter 26, and an output terminal for providing EQW.

Signal EQW causes transistors 21 and 22 to precharge bit lines 23 and 24. EQW is asserted in response to either signal BS being negated as a logic low, or signal $\overline{W}$ being negated as a logic high. A write recovery period occurs between a time at which either BS or $\overline{W}$ is negated, until voltages on bitlines 23 and 24 are substantially equal. EQW is negated in response to both signals BS and $\overline{W}$ being asserted, indicating a write access to the memory block in which bit line load 20 is located. When EQW is asserted, transistors 21 and 22 increase the voltage on the corresponding bit line, bit line 23 or bit line 24 repectively, to a base-to-emitter threshold voltage ($V_{BE}$) below EQW. Also typically an MOS transistor, coupled between bit line 23 and bit line 24 (not shown in FIG. 1), is made conductive to equalize the voltage therebetween. Because bit line load 20 uses bipolar transistors 21 and 22, the speed of precharging of the voltage on the bit lines after the termination of the write cycle is improved over the use of CMOS transistors.

There is a problem with bit line load 20, however. During the write recovery period, bit line load 20 provides a voltage on bit lines 23 and 24 equal to approximately (EQW−$V_{BE}$). However, during a write cycle EQW is negated to a logic low. NAND gate 27, typically implemented using CMOS transistors, provides EQW at a logic low voltage very close to the negative power supply voltage, designated "$V_{SS}$", typically at zero volts. Hence, a large reverse bias is developed between the emitter and the base of either transistor 21 or transistor 22. If the maximum reverse bias is designated "$V_{RBMAX}$", then $$V_{RBMAX} = EQW - V_{BE} - V_{SS} \qquad (1)$$

If EQW is equal to 5 volts, $V_{BE}$ is equal to 0.7 volts, and $V_{SS}$ is equal to 0 volts, $V_{RBMAX}$ would equal 4.3 volts. Over time, the constant application of this large reverse bias may cause transistor 21 or transistor 22 to fail, resulting in a failure of the entire memory. Electronically, a large reverse bias on a PN junction causes hot carrier injection into the overlying oxide, resulting in poor junction performance. See, for example, "Hot-Carrier Degradation in Bipolar Transistors at 300 and 110K-Effect on BiCMOS Inverter Performance", by Burnett and Hu in *IEEE Transactions on Electron Devices*, vol. 37, no. 4, April 1990, pp. 1171–1173. The amount of hot carrier injection is proportional to the time the reverse bias occurs. The size of $V_{RBMAX}$ is related to the mean life of the transistor, for given worst case conditions, by an inverse semilogarithmic relationship; as $V_{RBMAX}$ decreases linearly, mean life increases exponentially. At a $V_{RBMAX}$ of 4.3 volts, transistor mean life of bit line load 20 is unacceptably short.

Figure 2:
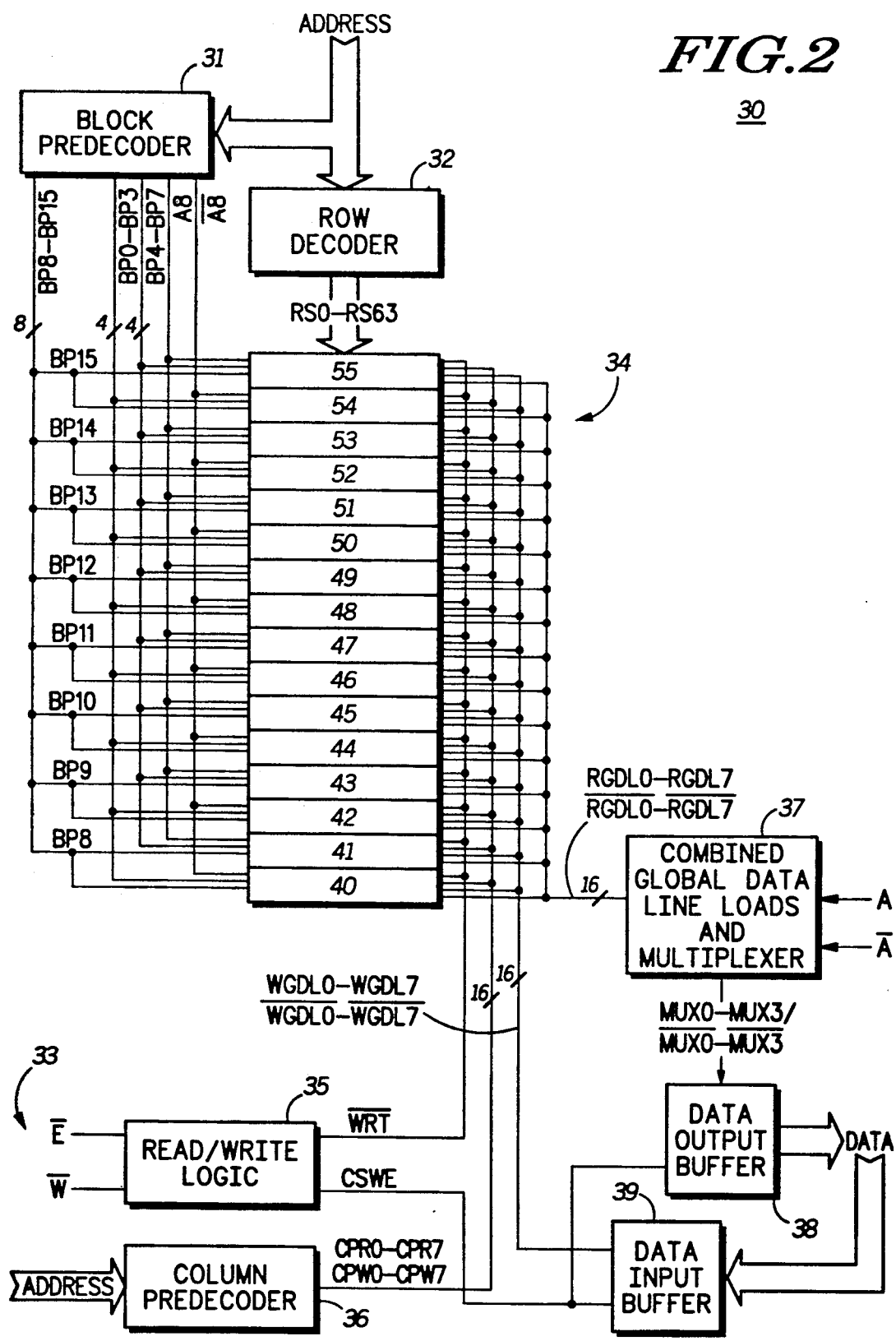
FIG. 2 illustrates in block form a memory incorporating the present invention.

FIG. 2 illustrates in block form a memory 30 incorporating the present invention. FIG. 2 shows features pertinent to understanding the present invention, but omits other features. Memory 30 comprises generally a block predecoder 31, a row decoder 32, an input/output portion 33, and a memory block portion 34. Input/output portion 33 comprises a read/write logic block 35, a column predecoder 36, a combined global data line loads and multiplexer portion 37, a data output buffer 38, a data input buffer 39, and a decoder 56. Memory block portion 34 comprises a plurality of memory blocks; in the illustrated embodiment, memory block portion 34 comprises sixteen memory blocks 40-55.

Block predecoder 31 receives a first portion of an address comprising a plurality of address signals labelled "ADDRESS" and provides predecoded block signals labelled "A8", "$\overline{\text{A8}}$", "BP0-BP3", "BP4-BP7", and "BP8-BP15" in response. A particular memory block receives a unique combination of predecoded block signals which determines when the block is selected. Even-numbered memory blocks receive A8, whereas odd-numbered blocks receive $\overline{\text{A8}}$; memory blocks 40 and 41, 42 and 43, 44 and 45, 46 and 47, 48 and 49, 50 and 51, 52 and 53, and 54 and 55 respectively receive signals BP8, BP9, BP10, BP11, BP12, BP13, BP14, and BP15. Even-numbered memory blocks receive BP0-BP3, whereas odd-numbered memory blocks receive BP4-BP7, for further decoding. Row decoder 32 receives a second portion of ADDRESS and provides row select signals labelled "RS0-RS63" in response. RS0-RS63 are provided to each memory block.

Read/write logic block 35 receives as inputs an enable signal labelled "$\overline{\text{E}}$", and a write signal labelled "$\overline{\text{W}}$". Read/write logic block 35 provides a write signal labelled "$\overline{\text{WRT}}$" to each of memory blocks 40-55, and a control signal labelled "CSWE" to data output buffer 38 and data input buffer 39 in response. $\overline{\text{WRT}}$ is a buffered signal indicating a write cycle is in progress. CSWE is a signal indicating that either a read cycle or a write cycle is in progress. Column predecoder 36 receives a third portion of ADDRESS and provides a plurality of predecoded column signals labelled "CPR0-CPR7" and "CPW0-CPW7" in response. Combined global data line loads and multiplexer 37 receive buffered address signals labelled "A" and "$\overline{\text{A}}$" and couple to each of 8 differential global data line pairs labelled "RGDL0-RGDL7" and "$\overline{\text{RGDL0-RGDL7}}$". Note that the buffering of address signals A and $\overline{\text{A}}$ is not shown in FIG. 2. Combined global data line loads and multiplexer 37 provide output signals labelled "MUX0-MUX3" and "$\overline{\text{MUX0-MUX3}}$" in response. Data output buffer 38 couples to MUX0-MUX3 and $\overline{\text{MUX0-MUX3}}$ and provides one or more data signals labelled "DATA" in response. The number of signals in DATA corresponds to the number of output signal pairs provided by combined global data line loads and multiplexer 37. Here there are four output signal pairs provided by combined global data line loads and multiplexer 37, and thus four output signals provided on DATA. Hence the organization of memory 30 is X4. The number of data bits provided by memory 30 may vary in different embodiments so the number of data signals in DATA is left indeterminate to illustrate this. Data input buffer 39 receives DATA and provides 8 write data line signal pairs labelled "WGDL0-WGDL7" and "$\overline{\text{WGDL0-WGDL7}}$" in response. Note that since memory 30 is X4, data input buffer 39 will only provide four signal pairs of the group WGDL0-WGDL7 and $\overline{\text{WGDL0-WGDL7}}$. The multiplexing of these signals is not shown in FIG. 2.

FIG. 2 is useful in understanding the operation of a memory in which the present invention operates. Memory 30 is capable of performing read and write cycles. Memory 30 is organized as 16 blocks, with each block organized as 256 rows and 64 columns. A function which can be considered row decoding uses the first portion of the address to enable one block and to enable one local word line in the block. Thus, row decoding decodes one of 4096 local word lines in memory 30. The row decoding function encompasses block predecoder 31 and row decoder 32. A local word line is enabled in an enabled memory block in response to RS0-RS63 and a plurality of predecoded block signals received from block predecoder 31. Column decoding decodes eight bit line pairs out of 64 bit line pairs on the enabled local word line. Row redundancy is also possible but is not shown in FIG. 2. Multiplexing is performed by a single address bit and its complement, A and $\overline{\text{A}}$. The input address comprises ADDRESS plus the extra address bit A. Since the organization of memory 30, and the portions of the input address used for particular decoding, may be altered in different embodiments, ADDRESS, A, and $\overline{\text{A}}$ are designated generically.

In the read cycle, signal $\overline{\text{E}}$ is asserted and signal $\overline{\text{W}}$ is negated. Read/write logic block 35 keeps signals $\overline{\text{WRT}}$ and CSWE negated. Block predecoder 31 selectively asserts signals A8, $\overline{\text{A8}}$, and BP0-BP15 in response to the first portion of ADDRESS. Row decoder 32 selectively asserts a row select signal of RS0-RS63 in response to the second portion of ADDRESS. The memory block selected by the predecoded signals A8, $\overline{\text{A8}}$, and a corresponding signal from the group BP8-BP15, then uses the remaining predecoded signals BP0-BP7, along with an active row select signal of RS0-RS63, to activate one local word line. Then within the selected block, each memory cell on the activated local word line provides its contents onto a corresponding differential bit line pair. Further column decoding among the bit line pairs is performed using CPR0-CPR7. The type of cycle in progress determines which signal is asserted, either one of CPR0-CPR7 for a read cycle, or one of CPW0-CPW7 for a write cycle. During the read cycle, one signal of CPR0-CPR7 is asserted to select one of eight bit line pairs in a selected memory block to output on a corresponding global data line pair. Thus, CPR0-CPR7 decode 8 of 64 bit lines. Eventually, eight bit line pairs are selected. A selected memory cell thus is located at an intersection of an enabled local word line and a selected bit line pair, in an enabled memory block.

The differential voltage on each of the eight selected bit line pairs is received and sensed by combined global data line loads and multiplexer 37. Two functions are performed: first, the output of the memory blocks, a differential current, is converted into a differential voltage. Second, four of eight global data line signals are multiplexed, based on $\overline{\text{SEL0}}$ and $\overline{\text{SEL1}}$, and provided as signals MUX0-MUX3 and $\overline{\text{MUX0-MUX3}}$. The data bits represented differentially as MUX0-MUX3 and $\overline{\text{MUX0-MUX3}}$ are then provided externally to memory 30 by data output buffer 38.

In the write cycle, the flow of data is essentially reversed. Data input buffer 39 receives DATA and provides four data bits diffentially onto corresponding write global data line pairs in response. As noted earlier, multiplexing of DATA as an input during the write cycle is not shown in FIG. 2. Since memory 30 is organized to store or provide four data bits of memory per access, DATA is provided on four pairs of the eight differential write global data line pairs WGDL0-WGDL7 and $\overline{\text{WGDL0-WGDL7}}$. Signals CPW0-CPW7 from column predecoder 36 are used in a selected memory block to perform column decoding to couple the four write global data lines to four bit line pairs. During the write cycle, one signal of CPW0-CPW7 is asserted to select one of eight bit line pairs in a selected memory block to output on a corresponding global data line pair. Thus, CPW0-CPW7 decode 8 of 64 bit lines. The local word line decoding occurs in the same manner as for the read cycle. The differential voltage developed on the bit line pairs is much larger for the write cycle than for the read cycle in order to overwrite the contents of the selected memory cells.

Figure 3:
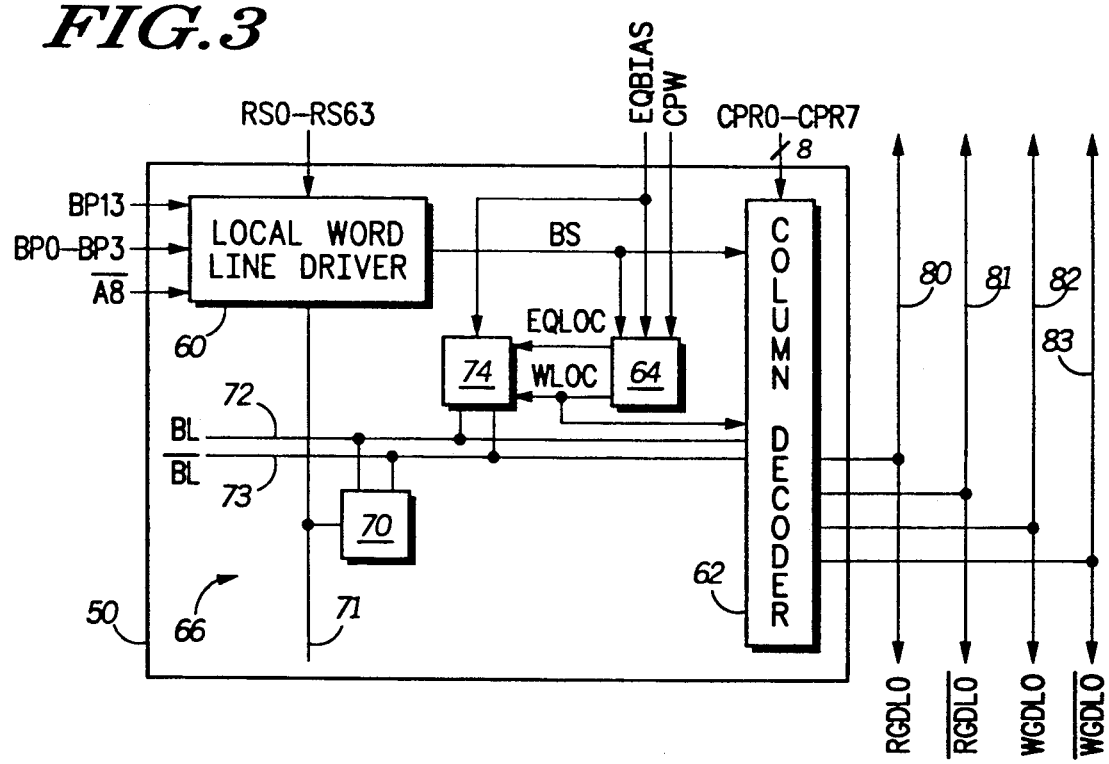
FIG. 3 shows a block diagram of a portion of a memory block of the memory of FIG. 2.

FIG. 3 illustrates in block form a portion of memory block 50 of memory 30 of FIG. 2. Memory block 50 comprises a local word line driver block 60, a column decoder 62, a control signal generator circuit 64, and a memory array 66. Local word line driver block 60 provides 256 local word line signals, including a representative local word line 71, in response to input row select signals RS0-RS63, block signals BP0-BP3 and BP13, and $\overline{A8}$. In addition, it provides a block select signal labelled "BS" in response to BP13 and $\overline{A8}$. Memory array 66 comprises a plurality of memory cells at each intersection of a local word line and a bit line pair. In FIG. 3, a representative memory cell 70 is located at an intersection of local word line 71 and a bit line pair comprising a bit line 72 providing a signal labelled "BL" thereon, and a bit line 73 providing a signal labelled "$\overline{BL}$" thereon. Bit lines 72 and 73 are coupled to column decoder 62. Column decoder 62 also receives a signal labelled "WLOC" and BS. WLOC is a signal of a group of signals labelled "WLOC0-WLOC7", not shown in FIG. 3, corresponding to the column address of memory cells on bit lines 72 and 73; it is designated generically to emphasize this fact. Coupled to bit lines 72 and 73 is bit line load 74, which receives as inputs EQBIAS, EQLOC, and WLOC. Control circuit 64 receives signals EQBIAS and CPW to provide signals EQLOC and WLOC. CPW is a signal of the group CPW0-CPW7, received by memory block 50, corresponding to the column address of memory cells on bit lines 72 and 73; it is designated generically to emphasize this fact. Other control circuits receive other corresponding predecoded column signals of the group CPW0-CPW7. Column decoder 62 receives eight signals CPR0-CPR7 and couples to each bit line pair in memory array 66, and couples to eight read global data line pairs (not all shown in FIG. 3). Shown in FIG. 3 is a read global data line pair comprising a first read global data line 80 providing RGDL0 thereon, and a second read global data line 81 providing $\overline{RGDL0}$ thereon, coupled to the output of column decoder 62; and a write global data line pair comprising a first write global data line 82 providing WGDL0 thereon, and a second write global data line 83 providing $\overline{WGDL0}$ thereon, coupled to an input of column decoder 62.

In operation, memory block 50 is selected by the assertion of predecoded signals $\overline{A8}$ and BP13. When $\overline{A8}$ and BP13 are asserted, local word line driver 60 asserts signal BS to activate selected bit line loads and to activate column decoding performed by column decoder 62. When memory block 50 is selected, local word line driver block 60 provides one of 256 word lines in response to RS0-RS63 and eight additional predecoded block signals BP0-BP7. In the read cycle, if memory block 50 is selected and local word line driver block 60 asserts local word line 71, then memory cell 70 couples a data bit stored therein differentially onto bit lines 72 and 73. Bit line load 74 provides an active pull up on bit lines 72 and 73. If a binary 1 is stored in memory cell 70, then a positive differential voltage is developed between BL and $\overline{BL}$. If a binary 0 is stored in memory cell 70, then a negative differential voltage is developed between BL and $\overline{BL}$. In either case, transistors in memory cell 70 have gate sizes sufficiently large to reduce a voltage provided by bit line load 74 enough so that a differential voltage may be recognized by column decoder 62. Column decoder 62 then decodes one pair of bit lines for each read global data line pair. Each selected bit line pair is coupled to a corresponding read global data line pair, and information stored in the corresponding selected memory cell is sensed and provided as a differential current onto the corresponding read global data line.

In the write cycle, data is provided differentially from eight write global data line pairs to corresponding selected memory cells. While the decoding occurs as in the read cycle, data is received by column decoder 62 during the write cycle from write global data lines 82 and 83 providing signals WGDL0 and $\overline{WGDL0}$ thereon. A principal difference between the read cycle and the write cycle is that during the read cycle a small differential voltage is developed on the bit line pair, but during the write cycle a large differential voltage is developed on the bit line pair by column decoder 62. While the voltage developed on the bit line pair during the write cycle must be large enough to overwrite a bit stored in a corresponding memory cell, the bit line load must precharge and equalize the voltage on the bit lines sufficiently after a write cycle to avoid disturbing a following read cycle.

Figure 4:
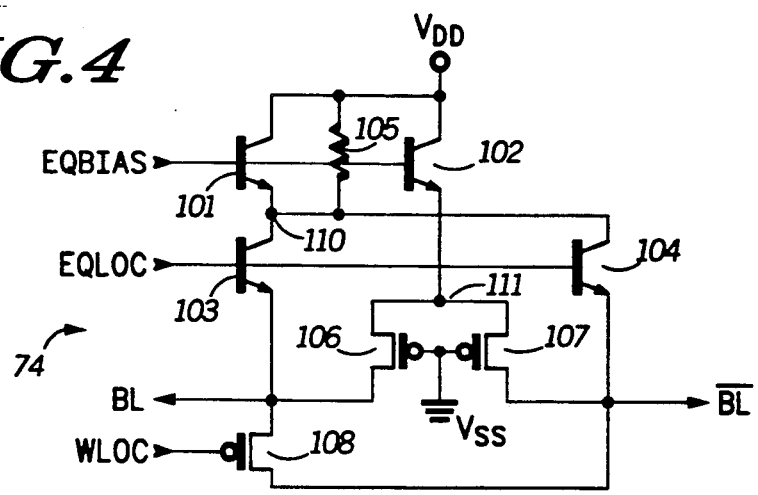
FIG. 4 illustrates in schematic form a bit line load and common voltage driver circuit shown in the memory block of FIG. 3.

FIG. 4 illustrates in schematic form bit line load 74 for use in memory 30, and NPN transistors 101 and 102 and resistor 105 used to bias bit line load 74. Bit line load 74 comprises NPN transistors 103, and 104; a resistor 105; and P-channel transistors 106, 107, and 108. Transistor 101 has a collector connected to $V_{DD}$, a base for receiving signal EQBIAS, and an emitter connected to a node 110. Transistor 102 has a collector connected to $V_{DD}$, a base for receiving signal EQBIAS, and an emitter connected to a node 111. Transistor 103 has a collector connected to node 110, a base for receiving signal EQLOC, and an emitter connected to bit line 72. Transistor 104 has a collector connected to node 110, a base for receiving signal EQLOC, and an emitter connected to bit line 73. Resistor 105 has a first terminal connected to $V_{DD}$, and a second terminal connected to node 110. Transistor 106 has a source connected to node 111, a gate connected to $V_{SS}$, and a drain connected to bit line 72. Transistor 107 has a source connected to node 111, a gate connected to $V_{SS}$, and a drain connected to bit line 73. Transistor 108 has a first current electrode connected to bit line 72, a gate for receiving signal WLOC, and a second current electrode connected to bit line 73. Which current electrode of transistor 108 functions as a source and which current electrode functions as a drain depends on the respective voltages on bit lines 72 and 73.

In basic operation, bit line load 74 serves two functions. First, bit line load 74 provides an active pull-up on both bit lines 72 and 73 for proper development of voltages BL and $\overline{BL}$ during the read cycle. During the read cycle, transistors 103 and 104 provide voltages on bit lines 72 and 73 in response to a differential current therefrom. In addition, transistors 106 and 107, which are always conductive, weakly pull up bit lines 72 and 73. Transistor 108 is also conductive during the read cycle to limit a differential voltage to a small amount, the small amount being just large enough to sense. Second, bit line load 74 equalizes and precharges the voltages on bit lines 72 and 73 during the write recovery period. Write recovery occurs during the transition from a write cycle to a read cycle. The precharging is accomplished by transistors 103 and 104 providing predetermined voltages on bit lines 72 and 73, and the equalization is accomplished by transistor 108 coupling together bit lines 72 and 73. The action of transistors 103, 104, and 108 ensures that voltages on bit lines 72 and 73 are substantially equal at the end of the write recovery period. Bit line load 74 provides an improvement over bit line load 20 of FIG. 1 because a worst-case reverse bias on bipolar transistors 103 and 104 is limited to a predetermined voltage, the predetermined voltage ensuring an acceptable mean life for the transistors under worst case conditions.

Specifically, transistor 101 provides a voltage on node 110 at one base-to-emitter diode voltage drop ($V_{BE}$) below the voltage on the signal EQBIAS, or (EQBIAS$-V_{BE}$). Similarly, transistor 102 provides a voltage on node 110 at a voltage equal to (EQBIAS$-V_{BE}$). Note that base-to-emitter diode voltage drop $V_{BE}$ is assumed to be equal for all transistors. In reality, bipolar transistor emitter size determines in part the $V_{BE}$ of a transistor; however, minor variations in $V_{BE}$ of the various transistors does not affect the invention. EQBIAS is set somewhat less than $V_{DD}$, and is made substantially independent of fluctuations in $V_{DD}$. If $V_{DD}$ is approximately 5 volts, EQBIAS may be set to approximately 4.2 volts. If the $V_{BE}$ of transistor 101 is 0.7 volts, then the voltage on node 110 is equal to approximately 3.5 volts.

During the write recovery period, transistors 103 and 104 increase the voltage on bit lines 72 and 73 to (EQLOC$-V_{BE}$). Signal EQLOC is provided at approximately EQBIAS during the read cycle. EQLOC is negated at a logic low of approximately two $V_{BE}$s above $V_{SS}$, about 1.4 volts, when a corresponding memory block is selected during the write cycle, and is asserted at a logic high of approximately EQBIAS, at about 4.2 volts, otherwise. The maximum reverse bias voltage ($V_{RBMAX}$) on transistors 103 and 104 occurs during a write cycle:

$$V_{RBMAX} = BL(\text{HIGH}) - EQLOC(\text{LOW}) \quad (2)$$

or approximately 3.5−1.4=2.1 volts. If $V_{BE}$ is equal to 0.7 volts and $V_{SS}$ is equal to 0 volts, $V_{RBMAX}$ would equal approximately 2.1 volts, which is significantly less than that of prior art bit line load 20 of FIG. 1.

The voltage supplied by transistor 101 and resistor 105 on node 110 may be shared between several bit line loads; similarly the voltage provided by transistor 102 on node 111 may be shared between several bit line loads. Thus, bit line load 74 is an equivalent representation of the bit line load circuit and does not represent all components unique to each bit line load. In the preferred embodiment, node 110 is shared by 64 bit line loads; the voltage on node 110 is provided by eight identical circuits within block 50 each having components corresponding to transistor 101 and resistor 105. The voltage on node 111 is shared between all sixteen memory blocks 40–55 of FIG. 2, with each memory block providing an identical circuit, the circuit comprising a transistor corresponding to transistor 102 having an emitter connected to node 111.

The combination of transistor 101 and resistor 105 to provide the voltage on node 110 has certain desired effects for the prevention of self-boosting. Self-boosting occurs when the voltage on the base of a bipolar transistor increases rapidly, where the emitter is coupled to a highly capacitive load. The base-emitter PN junction has an associated junction capacitance; when the voltage on the base is suddenly increased, a large base-emitter voltage is developed (since the highly capacitively load resists a sudden increase in voltage). The capacitance of a PN junction increases greatly when the $V_{BE}$ exceeds one diode voltage drop. Therefore, the base-emitter junction capacitance boosts the level of the base as the voltage at the emitter rises. Self-boosting can be stopped by reducing the charge on the base. One way to reduce the charge on the base is to cause the transistor to go into saturation, by forward biasing the base-collector diode. Transistor 101 and resistor 105 decrease the effect of self-boosting on the bases of transistors 103 and 104 by decreasing the voltage on the collectors of transistors 103 and 104 when a large collector current flows (during write recovery). Resistor 105 causes the voltage on node 110 to be at $V_{DD}$ when substantially no current flows, which occurs when EQLOC is at a logic low. In actuality a small reverse saturation current flows but if resistor 105 is sized correctly this current can be ignored. When EQLOC switches to a logic high, either transistor 103 or 104 becomes initially active because its base-emitter junction is forward biased into a bit line at a low voltage, and its base-collector junction is reverse biased. A collector current is provided flowing into node 110. With an appreciable current, the voltage on node 110 begins to drop due to the IR drop in resistor 105. However, transistor 101 keeps the voltage on node 110 from dropping below (EQBIAS$-V_{BE}$). When the base voltage of transistor 103 or transistor 104 rises by one diode voltage drop above (EQBIAS$-V_{BE}$) the excess base charge is discharged through the base-collector diode, and selfboosting is stopped. As the collector current of transistor 103 decreases, resistor 105 increases the voltage on the collector of transistor 103 to bring transistor 103 out of saturation.

Referring again to FIG. 3, two sources of reverse bias on base-to-emitter junctions of transistors 103 and 104 of FIG. 4 may be identified. First, as previously discussed, a reverse bias may be formed during a write cycle. The voltage on bit lines 72 and 73 is (EQLOC$-V_{BE}$) when precharging is complete. During a write cycle, EQLOC is provided as a logic low voltage. Thus, a difference between a logic high voltage and a logic low voltage on EQLOC must be limited to a predetermined number to assure an acceptable transistor life under worst case conditions. Second, during the write cycle, data input buffer 39 of FIG. 2 provides a data bit to be stored differentially onto a write global data line pair. Column decoder 62 then uses predecoded column signals WLOC0–WLOC7 to couple the write global data line pairs to selected bit lines pairs. To ensure that the worst case base-to-emitter reverse bias is less than the predetermined number established by EQLOC, data input buffer 39 of FIG. 2 limits a logic high voltage on a write global data line, for example WGDL0 or $\overline{WGDL0}$, to (EQLOC$-V_{BE}$). Note that column decoder 62 may decrease this voltage slightly when coupling the write global data lines to the bit line pairs.

Typical waveforms of control signals EQLOC and WLOC and other pertinent signals are shown in FIG. 5. The signals represented are WLOC, EQBIAS, BL, $\overline{BL}$, and EQLOC. FIG. 5 shows the variation in voltage of each of the pertinent signals with respect to time. A point in time labelled "t1" along the horizontal axis represents approximately a time division between a write cycle and a read cycle. Before time t1, the write cycle is in progress; between t1 and a time labelled "t2" is the write recovery period. EQBIAS is constant at approximately 4.2 volts. During the write cycle, a voltage is developed between BL and $\overline{BL}$. As previously noted, the voltage on BL and $\overline{BL}$ is provided by data input buffer 39 of FIG. 2 onto write global data lines which are coupled to column decoder 62 of FIG. 3 to selected bit line pairs. In the illustrated example a binary 1 is being provided as a positive differential voltage between BL and $\overline{BL}$. BL is at approximately 3.5 volts, while $\overline{BL}$ is approximately one $V_{BE}$ above $V_{SS}$, or about 0.7 volts. Therefore, there is a differential voltage of about 2.8 volts which is sufficient to ensure a fast transfer of data when the contents of a selected memory cell are overwritten during the write cycle. EQLOC is at $(V_{SS}+2V_{BE})$, or about 1.4 volts. When the write recovery period begins, EQLOC begins to rise at t1. As EQLOC rises, $\overline{BL}$ also rises. At the same time, WLOC is negated, which makes transistor 108 of FIG. 4 conductive, coupling bit lines 72 and 73 together. The voltage on $\overline{BL}$ rises until, at a time labelled "2", it approximately equals the voltage on BL. The maximum reverse bias, labelled "$V_{RB103}$", occurs in this case on transistor 103. In the illustrated embodiment, $V_{RB103}$ is $3.5-1.4=2.1$ volts. $V_{RB103}$ is therefore much less than the $V_{RBMAX}$ of 4.3 volts associated with prior art bit line load 20 of FIG. 1. The logic high and logic low voltages chosen for EQLOC, the source voltages of transistors 106 and 107 (shown in FIG. 4), and the voltages provided by data input buffer 39 (shown in FIG. 2) which are eventually coupled to corresponding bit lines, assure a worst case reverse bias of approximately 2.1 volts to guarantee a mean transistor lifetime of at least 10 years under worst case conditions. The logic high and logic low voltages for EQLOC also assure a fast transfer of data during the write cycle. The worst case conditions occur when a given memory cell is continually written to, at maximum specified voltage for $V_{DD}$, and at minimum specified temperature. Note that other transistor lifetimes may be assured by choosing smaller worst-case reverse-bias voltages.

FIG. 6 illustrates in partial schematic form control signal generator circuit 64 for use with the bit line load of FIG. 4. Circuit 64 comprises a NAND gate 121, N-channel transistors 135, 136, and 137, a resistor 138, a P-channel transistor 139, NPN transistors 140, 141, 142, and 143, an N-channel transistor 144, a P-channel transistor 145, and an inverter 146. NAND gate 121 comprises P-channel transistors 131 and 132, and N-channel transistors 133 and 134.

Transistor 131 has a source connected to EQBIAS, a gate for receiving signal BS, and a drain providing an output terminal of NAND gate 121. Transistor 132 has a source connected to EQBIAS, a gate for receiving signal labelled "CPW", and a drain connected to the drain of transistor 131. Transistor 133 has a drain connected to the drain of transistor 131, a gate for receiving signal BS, and a source. Transistor 132 has a drain connected to the source of transistor 133, a gate for receiving signal CPW, and a source connected to $V_{SS}$. Transistor 135 has a drain, a gate for receiving signal BS, and a source. Transistor 136 has a drain connected to the source of transistor 135, a gate for receiving signal CPW, and a source. Transistor 137 has a drain connected to the source of transistor 136, a gate connected to the drain of transistor 131, and a source connected to $V_{SS}$. Resistor 138 has a first terminal connected to EQBIAS, and a second terminal for providing EQLOC. Transistor 139 has a source connected to EQBIAS, a gate for receiving signal WLOC, and a drain connected to the second terminal of resistor 138. Transistor 140 has a collector connected to $V_{DD}$, a base connected to the drain of transistor 131, and an emitter connected to the second terminal of resistor 138 and the drain of transistor 139. Transistor 141 has a collector connected to the emitter of transistor 140, a base connected to the second terminal of resistor 138 and to the drain of transistor 139, and an emitter connected to the drain of transistor 135. Transistor 142 has a collector connected to the emitter of transistor 141, a base connected to the drain of transistor 137, and an emitter connected to $V_{SS}$. Transistor 143 has a collector connected to $V_{DD}$, a base connected to the drain of transistor 131, and an emitter. Transistor 144 has a first current electrode connected to the emitter of transistor 141, a gate connected to $V_{DD}$, and a second current electrode connected to the emitter of transistor 143. Transistor 145 has a source connected to $V_{DD}$, a gate for receiving signal WLOC, and a drain connected to the emitter of transistor 143. Inverter 146 has an input terminal connected to the emitter of transistor 143, and an output terminal for providing signal WLOC.

Circuit 64 may be understood first by the logical relation established between the input signals, and then by the way the components shown in FIG. 6 perform the functions. BS is a signal asserted at a logic high when a block in which a corresponding bit line pair is located is enabled. CPW is a signal asserted at a logic high when a write to the corresponding bit line pairs occurs, and corresponds to one signal of the group CPW0-CPW7. EQLOC, provided on the emitter of transistor 140, is a logical NAND between signals BS and CPW. WLOC, on the other hand, is provided as an inverse of the logical NAND between CPW and BS; in other words, as a logical AND between BS and CPW. While WLOC is provided at CMOS levels, with a logic high of approximately $V_{DD}$ and a logic low of approximately $V_{SS}$, EQLOC is provided with a logic high of approximately EQBIAS, and a logic low of approximately $V_{SS}+2V_{BE}$. As described earlier, limitation of the logic low voltage of EQLOC improves the mean lifetime of transistors 103 and 104 of FIG. 4.

The output terminal of NAND gate 121 is provided by the drain of transistor 131. When the output terminal of NAND gate 121 is a logic high, the base-emitter junction of transistor 140 becomes forward biased to provide EQLOC as a logic high. When the output of NAND gate 121 is a logic high, either transistor 131 or transistor 132, or both, is conductive. Since both transistors 131 and 132 are P-channel transistors connected to voltage EQBIAS, at approximately 4.2 volts, a logic low voltage on the gates makes the transistors conductive. A drain-to-source voltage $V_{DS}$ of each transistor is approximately zero volts, and the voltage on the output terminal of NAND gate 121 is approximately at EQBIAS. Therefore, the logic high voltage of EQLOC is approximately EQBIAS. On the other hand, (EQBIAS $-V_{BE}$) appears on the input terminal of inverter 146 and is latched to $V_{DD}$ by transistor 145. This voltage is recognized as a logic high by inverter 146, and the output terminal of inverter 136 is driven to a logic low. Transistor 139 is placed into saturation, increasing EQLOC to EQBIAS. In essence, then, inverter 146 and transistor 139 form a weak latch to increase EQLOC to EQBIAS once EQLOC crosses from a logic low to a logic high. Transistor 137 is made conductive by the output of NAND gate 121, and couples the base of transistor 142 to $V_{SS}$, keeping the base-emitter junction of transistor 142 from becoming forward biased, and therefore keeping any current from flowing into the collector of transistor 141 or 142.

When the output terminal of NAND gate 121 is a logic low, caused by both BS and CPW being a logic high, EQLOC is provided at approximately $(V_{SS}+2V_{BE})$. The base-emitter junction of transistor 140 becomes reverse biased, and transistor 139 becomes nonconductive. Transistors 135 and 136 both become conductive and couple the collector of transistor 142 to the base of transistor 142. Transistor 137 becomes nonconductive. Therefore, EQLOC is connected to $V_{SS}$ through two diode-connected transistors 141 and 142. Resistor 138 provides the bias current to keep the base-to-emitter diodes of transistors 141 and 142 forward biased.

With regard to WLOC, when the output of NAND gate 121 is a logic high, the voltage on the input terminal of inverter 146 is a logic high, and the output terminal of inverter 146 is a logic low. Transistor 145 then becomes conductive to provide a weak latch when the voltage at the input terminal of inverter 146 crosses from a logic low to logic high. When the output of NAND gate 121 switches to a logic low, transistor 143 becomes nonconductive. The high voltage developed on the input terminal of inverter 146 then causes transistor 144 to be conductive and to discharge the voltage on the input terminal of inverter 146 through transistor 142 to $V_{SS}$, until it passes below the switchpoint of inverter 146. It should be remembered that circuit 64 is but one embodiment for providing the waveforms shown in FIG. 5, and that other circuits are possible.

Figure 7:
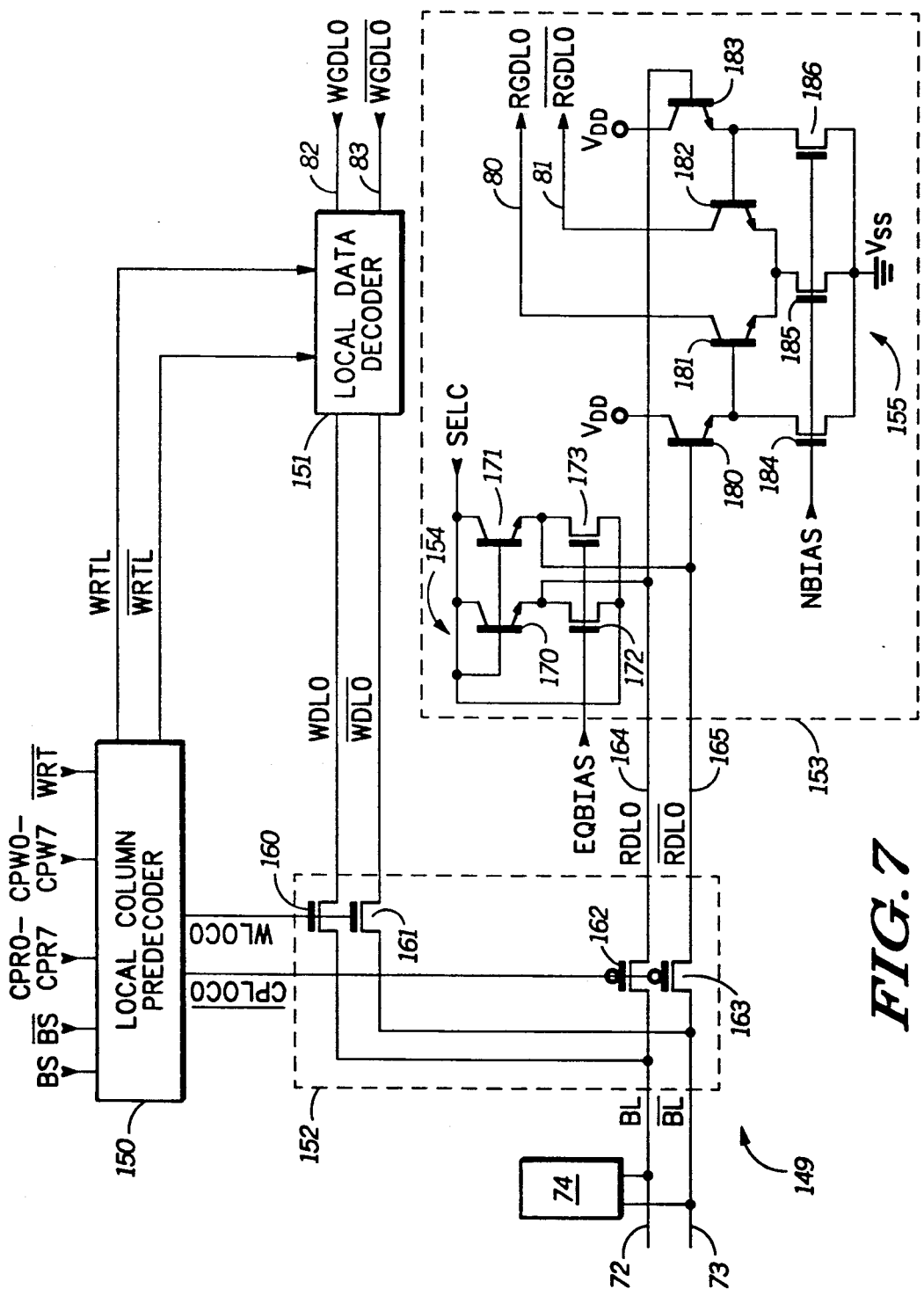
FIG. 7 illustrates in partial schematic and partial block form a portion of the column decoder of FIG. 3 including a sense circuit.

FIG. 7 illustrates in partial schematic form and partial block form a portion 149 of column decoder 62 of FIG. 3 including a sense circuit 153 in accordance with the present invention. FIG. 7 generally shows bit lines 72 and 73 and bit line load 74 of FIG. 3, a local column predecoder 150, a local data decoder 151, a bit line column decoder 152, data line load 154, and sense amplifier 155. More particularly, bit line column decoder 152 comprises N-channel transistors 160 and 161, and P-channel transistors 162 and 163. Sense circuit 153 comprises a data line load 154 and a sense amplifier 155. Data line load 154 comprises NPN transistors 170 and 171, and N-channel transistors 172 and 173. Sense amplifier 155 comprises NPN transistors 180, 181, 182, and 183, and N-channel transistors 184, 185, and 186.

As in FIG. 3, and more particularly illustrated in FIG. 4, FIG. 7 also shows bit line load 74 coupled to bit lines 72 and 73. Local column predecoder 150 receives block select signal BS, a complement of signal BS labelled "$\overline{BS}$", predecoded column signals CPR0–CPR7, predecoded column signals CPW0–CPW7, and write signal $\overline{WRT}$. In response local column predecoder 150 provides a read predecoded signal labelled "$\overline{CPLOC0}$", a write predecoded signal labelled "WLOC0", and true and complement local write signals labelled respectively "WRTL" and "$\overline{WRTL}$". Local data decoder 151 receives write global data line signals WGDL0 and $\overline{WGDL0}$, and local write signals WRTL and $\overline{WRTL}$, and provides write data line signals labelled "WDL0" and "$\overline{WDL0}$" in response. In bit line column decoder 152, transistor 160 has a drain for receiving WDL0, a gate for receiving signal WLOC0, and a source connected to bit line 72. Note that the designation of source and drain is arbitrary since at different times either current electrode may be at a positive potential with respect to the other current electrode. Transistor 161 has a drain for receiving signal $\overline{WDL0}$, a gate for receiving signal WLOC0, and a source connected to bit line 73. Transistor 162 has a source connected to bit line 72, a gate for receiving signal $\overline{CPLOC0}$, and a drain for providing a signal labelled "RDL0" on a read data line 164. Transistor 163 has a source connected to bit line 73, a gate for receiving signal $\overline{CPLOC0}$, and a drain for providing a signal labelled "$\overline{RDL0}$" on a read data line 165.

In read data line load 154, transistor 170 has a collector for receiving a select signal labelled "SELC", a base for receiving signal SELC, and an emitter coupled to read data line 164. Transistor 171 has a collector for receiving signal SELC, a base for receiving signal SELC, and an emitter coupled to read data line 165. Transistor 172 has a drain for receiving signal SELC, a gate for receiving signal EQBIAS, and a source connected to the emitter of transistor 170 and to read data line 164. Transistor 173 has a drain for receiving signal SELC, a gate for receiving signal EQBIAS, and a source connected to the emitter of transistor 171 and to read data line 165. In sense amplifier 155, transistor 180 has a collector connected to $V_{DD}$, a base connected to read data line 165 for receiving signal $\overline{RDL0}$ thereon, and an emitter. Transistor 181 has a collector coupled to a read global data line 81 for providing signal RGDL0 thereon, a base connected to the emitter of transistor 180, and an emitter. Transistor 182 has a collector coupled to a read global data line 80 for providing signal $\overline{RGDL0}$ thereon, a base, and an emitter connected to the emitter of transistor 181. Transistor 183 has a collector connected to $V_{DD}$, a base coupled to read data line 164 for receiving signal RDL0, and an emitter connected to the base of transistor 182. Transistor 184 has a drain connected to the emitter of transistor 180, a gate for receiving a bias signal labelled "NBIAS", and a source connected to $V_{SS}$. Transistor 185 has a drain connected to the emitters of transistors 181 and 182, a gate for receiving NBIAS, and a source connected to $V_{SS}$. Transistor 186 has a drain connected to the emitter of transistor 183, a gate for receiving NBIAS, and a source connected to $V_{SS}$.

In operation, portion 149 of column decoder 62 of FIG. 3 illustrated in FIG. 7 performs column decoding for read and write cycles, and data sensing during read cycles. In response to a write cycle to the corresponding memory block, indicated when both BS and $\overline{WRT}$ are asserted, local column predecoder 150 asserts WRTL and $\overline{WRTL}$. In response, local data decoder 151 couples write global data line signals WGDL0 and $\overline{WGDL0}$ respectively to WDL0 and $\overline{WDL0}$. Local column predecoder 150 provides eight predecoded signals, WLOC0 and seven others not shown in FIG. 7, to couple WDL0 and $\overline{WDL0}$ to one of eight bit line pairs. WLOC0 is an active-high signal which makes transistors 160 and 161 conductive to couple signals WDL0 and $\overline{WDL0}$ to bit lines 72 and 73 when asserted. WLOC0 is asserted in response to CPW0–CPW7 during the write cycle.

When the corresponding memory block is selected during the read cycle, local column predecoder 150 provides eight predecoded signals, $\overline{CPLOC0}$ and seven others not shown in FIG. 7, to couple one of eight bit line pairs to a corresponding read data line pair in response to CPR0-CPR7. $\overline{\text{CPLOC0}}$ is an active-low signal which makes transistors 162 and 163 conductive to couple bit lines 72 and 73 respectively to read data lines 164 and 165 when asserted. Seven other pairs of bit lines not shown are selectively coupled to read data lines 164 and 165 through P-channel transistors like transistors 162 and 163. A one-of-eight decode occurs on the eight bit line pairs to provide the one data line signal pair RDL0 and $\overline{\text{RDL0}}$ respectively on read data lines 164 and 165.

Read data line load 154 couples read data lines 164 and 165 to a logic low voltage of approximately $V_{SS}$ during the write cycle or when the corresponding memory block is not selected. When a read cycle to the corresponding memory block begins SELC is asserted at a logic high of $(EQBIAS - V_{BE})$. Bipolar transistors 170 and 171 quickly couple read data lines 164 and 165 to a predetermined voltage, the predetermined voltage equal to the select signal minus a $V_{BE}$ of transistor 170 or 171, or $(SELC - V_{BE})$. When the voltage on read data lines 164 and 165 exceeds $(SELC - V_{BE})$, the base-emitter junctions of bipolar transistors 170 and 171 are no longer forward biased and bipolar transistors 170 and 171 become inactive. Thereafter, the voltage on bit lines 72 and 73 continues to increase the voltage on read data lines 164 and 165, through transistors 162 and 163, until the voltage reaches approximately $(EQBIAS - V_{BE})$, as illustrated earlier in the discussion of FIGS. 4 and 5. After read data line load 154 becomes inactive, a differential voltage between read data lines 164 and 165 is determined by the contents of the selected memory cell. As described earlier in the discussion of FIGS. 4 and 5, the voltages provided on bit lines 72 and 73 are approximately $(EQBIAS - V_{BE})$, as determined by bit line load 74. Since the logic high of signal SELC is also approximately $(EQBIAS - V_{BE})$, the voltages of the bit lines and the read data lines are approximately equal.

The predetermined voltage provided on RDL0 and $\overline{\text{RDL0}}$ by read data line load 154 quickly enables sense amplifier 155. When the voltage on RDL0 and $\overline{\text{RDL0}}$ is at a logic low of SELC, approximately $V_{SS}$, amplifier 155 is disabled. However, in response to the start of the read cycle, sense amplifier 155 is enabled and senses a differential voltage between bit lines 72 and 73 determined by the bit stored in the selected memory cell. The differential voltage sensed by sense amplifier 155 is provided as a differential current on global data lines 80 and 81. Then, as previously illustrated in FIG. 2, combined global data line loads and multiplexer 37 converts the differential current into a differential voltage for eventual output as signal group DATA.

More particularly, sense amplifier 155 is enabled when the voltage on either read data line 164 or 165 exceeds a predetermined voltage of approximately $(V_{SS} + 2V_{BE})$. When the corresponding memory block is not selected during the read cycle, SELC is negated and transistors 172 and 173 are conductive, coupling data lines 172 and 173 to SELC at approximately $V_{SS}$. Since transistors 180 and 181 are emitter followers, the voltage on the emitter of transistor 181 follows the voltage on the base of transistor 180 but at $2V_{BE}$ below. As the voltage on read data line 165 drops toward $V_{SS}$, the voltage on the emitter of transistor 181 drops. When the voltage on the base of transistor 181 reaches zero, transistor 181 is no longer in the active region. Hence substantially no current is drawn from read global data line 81. Similarly, because the voltage on read data line 164 also approaches the logic low voltage of approximately $V_{SS}$, transistor 182 is no longer in the active region and substantially no current is drawn from read global data line 80. Hence, when SELC is negated, sense amplifier 155 is disabled.

When SELC is asserted, the voltages on the emitters of transistors 170 and 171 rise to approximately $(SELC - V_{BE})$, which is equal to $(EQBIAS - 2V_{BE})$, before eventually rising to SELC. The voltages on the emitters of transistors 180 and 183 follow the voltages on read data lines 165 and 164, respectively, minus one $V_{BE}$. The selected memory cell provides a differential signal between BL and $\overline{BL}$, which is reflected as a differential voltage between the voltage on the bases of transistor 182 and 181. The voltage differences causes transistors 182 and 181 to be more or less conductive with respect to each other, and hence to selectively divert the current sourced by transistor 185 in response to the voltage difference. NBIAS is a voltage which is generated on-chip and which biases N-channel MOS transistors to function as current sources. Transistors 182 and 181 are in the active region, and a small difference in voltage is reflected in a large difference in output current on read global data lines 80 and 81. Sense amplifier 155 is thus a transconductance amplifier, converting a differential voltage into a differential current. Subsequently, combined global data line loads and multiplexer 37 of FIG. 2 convert the differential current provided on read global data lines 80 and 81 into a differential voltage for final sensing and outputting. Read data line load 154 couples read data lines 164 and 165 to a voltage high enough to enable sense amplifier 155 through bipolar transistors 170 and 171, which switch faster than corresponding MOS transistors. Then read data line load 154 becomes inactive. Thus, sense circuit 153 improves the speed of the sensing function over the speed which could be accomplished with a MOS design, while keeping power consumption to a minimum.

Figure 8:
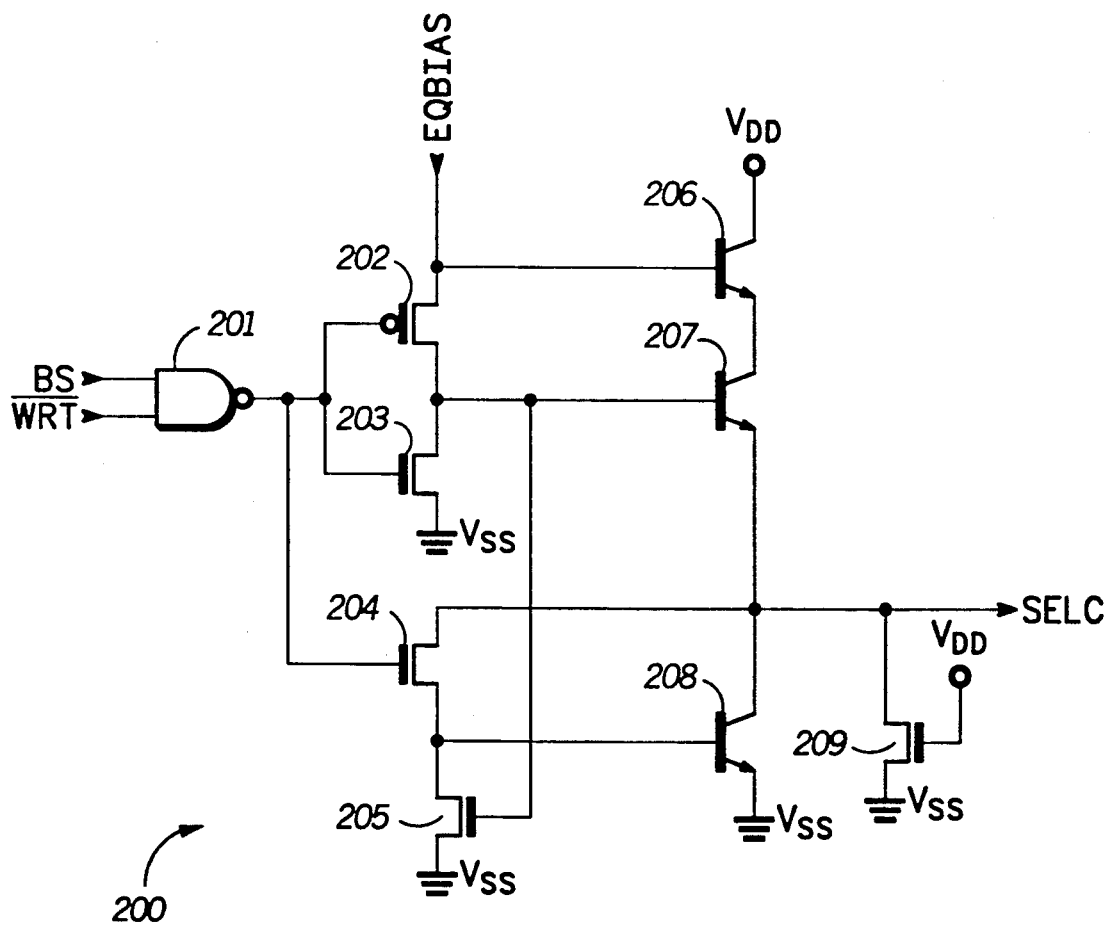
FIG. 8 illustrates in partial schematic form a control circuit used to generate a control signal for the data line load of FIG. 7.

FIG. 8 illustrates in partial schematic form a control circuit 200 used to generate a control signal for data line load 154 of FIG. 7. Control circuit 200 is one circuit which can be used to generate signal SELC with the proper logic levels and with the proper relation to signals BS and $\overline{\text{WRT}}$, but others may also be used. Control circuit 200 comprises a NAND gate 201, a P-channel transistor 202, N-channel transistors 203, 204, and 205, NPN transistors 206, 207, and 208, and an N-channel transistor 209. NAND gate 201 has a first input terminal for receiving signal BS, a second input terminal for receiving signal $\overline{\text{WRT}}$, and an output terminal. Transistor 202 has a source for receiving signal EQBIAS, a gate connected to the output terminal of NAND gate 201, and a drain. Transistor 203 has a drain connected to the drain of transistor 202, a gate connected to the output terminal of NAND gate 201, and a source connected to $V_{SS}$. Transistor 204 has a drain, a gate connected to the output terminal of NAND gate 201, and a source. Transistor 205 has a drain connected to the source of transistor 204, a gate connected to the drain of transistor 202, and a source connected to $V_{SS}$. Transistor 206 has a collector connected to $V_{SS}$, a base for receiving signal EQBIAS, and an emitter. Transistor 207 has a collector connected to the emitter of transistor 206, a base connected to the drain of transistor 202, and an emitter for providing signal SELC. Transistor 208 has a collector connected to the emitter of transistor 207 and to the drain of transistor 204, a base connected to the source of transistor 204, and an emitter connected to $V_{SS}$. Transistor 209 has a drain connected to the emitter of transistor 207, a gate connected to $V_{DD}$, and a source connected to $V_{SS}$.

In operation, control circuit 200 provides signal SELC at a logic high in response to signal BS being asserted and $\overline{WRT}$ being negated, or in other words, when a corresponding memory block is selected during a read cycle. In that case, the output of NAND gate 201 is a logic low. Transistors 202 and 203 logically function as an inverter, and the voltage on the drain of transistor 202 is a logic high of approximately EQBIAS. Transistor 204 is nonconductive, and transistor 205 is conductive, coupling the base of transistor 208 to $V_{SS}$ to prevent it from being conductive. At the same time, transistor 207 is made conductive by the application of approximately EQBIAS to the base. The voltage of SELC then is one base-to-emitter diode voltage drop below the voltage of the base, or approximately (EQBIAS $-V_{BE}$). The emitter of transistor 206 is coupled to the collector of transistor 207 to provide a voltage less than either $V_{DD}$ or EQBIAS. The emitter of transistor 206 is set at a voltage of (EQBIAS $-V_{BE}$). When the voltage on the base of transistor 207 is a logic high at approximately EQBIAS, the reduced voltage on the collector of transistor 207 makes transistor 207 begin to saturate as the voltage on the base approaches EQBIAS, to prevent self-boosting of the base of transistor 206. When the corresponding memory block is not selected or a write cycle is in progress (BS or $\overline{WRT}$ at a logic low), the output of NAND gate 201 is at a logic high, making transistor 204 conductive, which couples together the collector and the emitter of transistor 204 to provide SELC at a logic low. The voltage on the drain of transistor 202 is a logic low, and transistor 207 is nonconductive. Transistor 209, which is always conductive, is provided as a weak pulldown to SELC to decrease the voltage on SELC to $V_{SS}$ when SELC is provided as a logic low. Using typical values, SELC has a logic high voltage of approximately (EQBIAS $-V_{BE}$), or 3.5 volts, and a logic low voltage of approximately $V_{SS}$, or 0 volts. The predetermined voltage at which point sense amplifier 155 becomes active is equal to approximately ($V_{SS}+2V_{BE}$), or about 1.4 volts.

Figure 9:
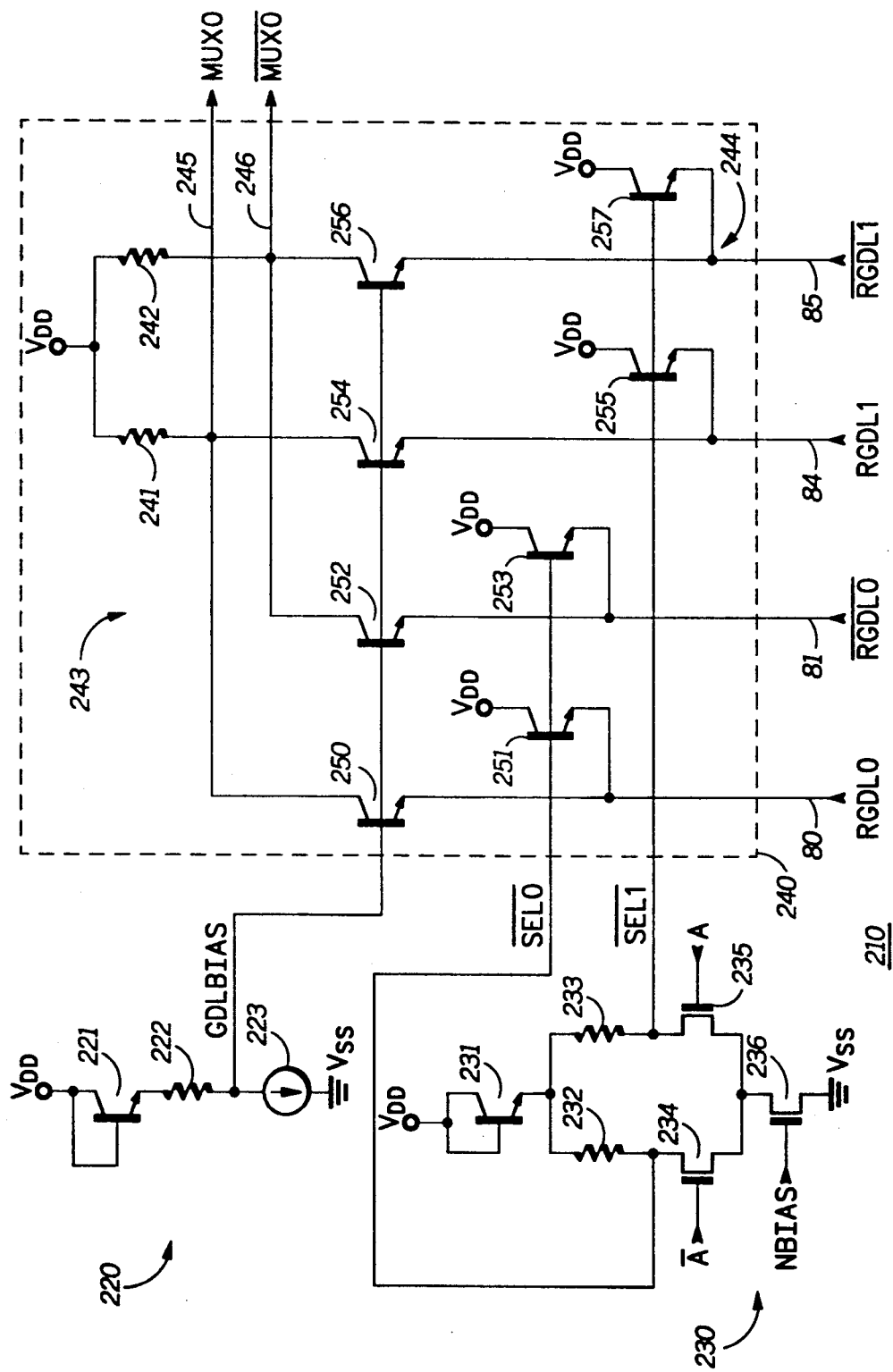
FIG. 9 is a partial schematic diagram of a portion of the combined global data line load and multiplexer of FIG. 2.

FIG. 9 is a partial schematic diagram of a portion 210 of combined global data line loads and multiplexer 37 of FIG. 2. Portion 210 is coupled to read global data lines 80 and 81 which respectively conduct signals RGDL0 and $\overline{RGDL0}$, as shown in FIG. 3. In addition portion 210 is coupled to a read global data line 84 and a read global data line 85. Read global data lines 84 and 85 respectively conduct signals RGDL1 and $\overline{RGDL1}$, previously shown as part of the signal group RGDL0–RGDL7/$\overline{RGDL0}$–$\overline{RGDL7}$ of FIG. 2. Portion 210 comprises generally a bias generator circuit 220, a decoder 230, and a global data line load/multiplexer portion 240. Bias generator circuit 220 comprises an NPN transistor 221, a resistor 222, and a current source 223. Decoder 230 comprises an NPN transistor 231, resistors 232 and 233, and N-channel transistors 234, 235, and 236. Global data line load/multiplexer portion 240 comprises resistors 241 and 242, and switching portions 243 and 244. Switching portion 243 comprises NPN transistors 250, 251, 252, and 253. Switching portion 244 comprises NPN transistors 254, 255, 256, and 257.

In bias generator circuit 220, transistor 221 has a collector connected to $V_{DD}$, a base connected to $V_{DD}$, and an emitter. Resistor 222 has a first terminal connected to the emitter of transistor 221, and a second terminal for providing a bias signal labelled "GDLBIAS". In decoder 230, transistor 231 has a collector connected to $V_{DD}$, a base connected to $V_{DD}$, and an emitter. Resistor 232 has a first terminal connected to the emitter of transistor 231, and a second terminal for providing signal $\overline{SEL0}$. Resistor 233 has a first terminal connected to the emitter of transistor 231, and a second terminal for providing signal $\overline{SEL1}$. Transistor 234 has a drain connected to the second terminal of resistor 232, a gate for receiving signal $\overline{A}$, and a source. Transistor 235 has a drain connected to the second terminal of resistor 233, a gate for receiving signal A, and a source connected to the source of transistor 234. Transistor 236 has a drain connected to the sources of transistors 234 and 235, a gate for receiving bias signal NBIAS, and a source connected to $V_{SS}$.

In switching portion 243 of global data line load/multiplexer portion 240, resistor 241 has a first terminal connected to $V_{DD}$, and a second terminal for providing $\overline{MUX0}$ on a signal line 245. Resistor 242 has a first terminal connected to $V_{DD}$, and a second terminal for providing MUX0 on a signal line 246. Transistor 250 has a collector connected to the second terminal of resistor 241, a base for receiving signal GDLBIAS, and an emitter coupled to read global data line 80. Transistor 251 has a collector connected to $V_{DD}$, a base for receiving signal $\overline{SEL0}$, and an emitter connected to read global data line 80. Transistor 252 has a collector connected to the second terminal of resistor 242, a base for receiving signal GDLBIAS, and an emitter coupled to read global data line 81. Transistor 253 has a collector connected to $V_{DD}$, a base for receiving signal $\overline{SEL0}$, and an emitter connected to read global data line 81. Transistor 254 has a collector connected to the second terminal of resistor 241, a base for receiving signal GDLBIAS, and an emitter coupled to read global data line 84. Transistor 255 has a collector connected to $V_{DD}$, a base for receiving signal $\overline{SEL1}$, and an emitter connected to read global data line 84. Transistor 256 has a collector connected to the second terminal of resistor 242, a base for receiving signal GDLBIAS, and an emitter coupled to read global data line 85. Transistor 257 has a collector connected to $V_{DD}$, a base for receiving signal $\overline{SEL1}$, and an emitter connected to read global data line 85.

Portion 210 shows two read global data line pairs, 80/81 and 84/85 for carrying signal pairs RGDL0/$\overline{RGDL0}$ and RGDL1/$\overline{RGDL1}$ and multiplexed to provide one signal pair MUX0 and $\overline{MUX0}$ in response to an input address bit A and its complement A. In the embodiment illustrated in FIG. 2, memory 30 is a X4 memory. The eight read global data line pairs RGDL0–RGDL7/$\overline{RGDL0}$–$\overline{RGDL7}$ are multiplexed into four signal pairs MUX0–MUX3/$\overline{MUX0}$–$\overline{MUX3}$. Note that three additional global data line load/multiplexers providing signals MUX1–MUX3/$\overline{MUX1}$–$\overline{MUX3}$ are not shown in FIG. 9 but are structurally identical to global data line load/multiplexer 240 which is shown in FIG. 9. Specifically, a second global data line load/multiplexer providing output signals MUX1/$\overline{MUX1}$, not shown in FIG. 9, corresponds to RGDL2/$\overline{RGDL2}$ and RGDL3/$\overline{RGDL3}$. A third global data line load/multiplexer and providing output signals MUX2 and $\overline{MUX2}$, not shown in FIG. 9, corresponds to RGDL4/$\overline{\text{RGDL4}}$ and RGDL5/$\overline{\text{RGDL5}}$. A fourth global data line load/multiplexer providing output signals MUX3 and $\overline{\text{MUX3}}$, not shown in FIG. 9, corresponds to RGDL6/$\overline{\text{RGDL6}}$ and RGDL7/$\overline{\text{RGDL7}}$.

Decoder 230 provides two signals, $\overline{\text{SEL0}}$ and $\overline{\text{SEL1}}$, in response to an input address signal A and its complement $\overline{\text{A}}$. $\overline{\text{SEL0}}$ is asserted at a logic low in response to input address bit A being in a first predetermined state, namely a logic low. $\overline{\text{SEL0}}$ is asserted at a logic low in response to input address bit A being in a second predetermined state, namely a logic high. Transistor 231 ensures that a logic high voltage is equal to $(V_{DD}-V_{BE})$.

If A is asserted at a logic high (and $\overline{\text{A}}$ is asserted as a logic low), then transistor 235 is conductive, and $\overline{\text{SEL1}}$ is asserted. The logic low voltage of $\overline{\text{SEL1}}$ is determined by the size of transistor 236 and the value of resistor 233. $\overline{\text{SEL0}}$ is negated at a logic high which, as indicated earlier, is equal to $(V_{DD}-V_{BE})$. If A is negated at a logic low (and $\overline{\text{A}}$ is negated at a logic high), then $\overline{\text{SEL0}}$ is asserted and $\overline{\text{SEL1}}$ is negated. If the gate sizes of transistors 234 and 235 are equal, and if the values of resistors 232 and 233 are equal, then the logic high voltage of $\overline{\text{SEL0}}$ will equal the logic high voltage of $\overline{\text{SEL1}}$, and the logic low voltage of $\overline{\text{SEL0}}$ will equal the logic low voltage of $\overline{\text{SEL1}}$.

Bias generator circuit 220 provides voltage bias signal GDLBIAS to bias bipolar transistors in global data line load/multiplexer portion 240. In the illustrated embodiment, the value of resistors 232 and 233 are equal. Let $I_{223}$ equal the current of current source 223, and $I_{236}$ be the current sourced by transistor 236; and $R_{222}$ equal the resistance of resistor 222 and $R_{232}$ equal the resistance of resistor 232 (or 233). For any emitter-coupled transistor pair in global data line load/multiplexer portion 240 to switch current, $$I_{236}R_{232} > I_{223}R_{222} \qquad (3)$$

where an emitter coupled pair is, for example, transistors 250 and 251. GDLBIAS is thus a voltage between the logic high and the logic low voltage of $\overline{\text{SEL0}}$ and $\overline{\text{SEL1}}$.

Each emitter coupled pair of transistors operates as a current switch controlled by GDLBIAS and a corresponding select signal. Thus if $\overline{\text{SEL0}}$ is a logic low, then transistors 251 and 253 are less conductive than transistors 250 and 252, and thus substantially all the current sourced through global data lines 80 and 81 is conducted through transistors 250 and 252, respectively. The voltages of MUX0 and $\overline{\text{MUX0}}$ are approximately equal to power supply voltage $V_{DD}$ minus the currents on read global data lines 80 and 81 times the values of resistors 241 and 242, respectively. Thus a differential voltage between signals MUX0 and $\overline{\text{MUX0}}$ is provided proportional to a differential current provided on read global data lines 80 and 81, when the corresponding select signal $\overline{\text{SEL0}}$ is less than GDLBIAS. When $\overline{\text{SEL0}}$ is a logic low, $\overline{\text{SEL1}}$ is a logic high. Since the logic high voltage of $\overline{\text{SEL1}}$ is greater than GDLBIAS, transistors 255 and 257 are substantially more conductive than transistors 254 and 256, and thus the differential current on read global data lines 84 and 85 substantially flows through transistors 255 and 257 to $V_{DD}$. The differential current of read global data lines 84 and 85 leaves the voltages of MUX0 and $\overline{\text{MUX0}}$ substantially unaffected in this case.

The correspondence between the global data lines, multiplexed output signal lines, and select signals should be noted. In the illustrated embodiment, eight global data line pairs are multiplexed into four output signal line pairs. An extra address bit A selects between even and odd read global data line pairs of groups of two consecutive global data line pairs. $\overline{\text{SEL0}}$ thus corresponds to read global data line pairs RGDL0/$\overline{\text{RGDL0}}$, RGDL2/$\overline{\text{RGDL2}}$, RGDL4/$\overline{\text{RGDL4}}$, and RGDL6/$\overline{\text{RGDL6}}$, and $\overline{\text{SEL1}}$ corresponds to read global data line pairs RGDL1/$\overline{\text{RGDL1}}$, RGDL3/$\overline{\text{RGDL3}}$, RGDL5/$\overline{\text{RGDL5}}$, and RGDL7/$\overline{\text{RGDL7}}$. In an alternative embodiment, eight global data line pairs are multiplexed to a single output data line pair in a X1 memory. In the X1 memory, three additional address bits are necessary to provide a one-of-eight decode. A decoder for the X1 memory receives the three extra address bits and provides eight select signals each corresponding to a different state of the three extra address bits. The global data line load/multiplexer portion comprises eight switching portions. However each switching portion is coupled to the single output signal line pair. As before, the output signal line pair is coupled to $V_{DD}$ through two resistors. Note also that transistor types may be varied. For example, in an embodiment in which bipolar transistors are not available, MOS transistors may be used instead of transistors 250-257. In this embodiment, bipolar transistors 221 and 231 may not be needed, and select signals provided by decoder 230 are provided at substantially CMOS logic levels.

Figure 10:
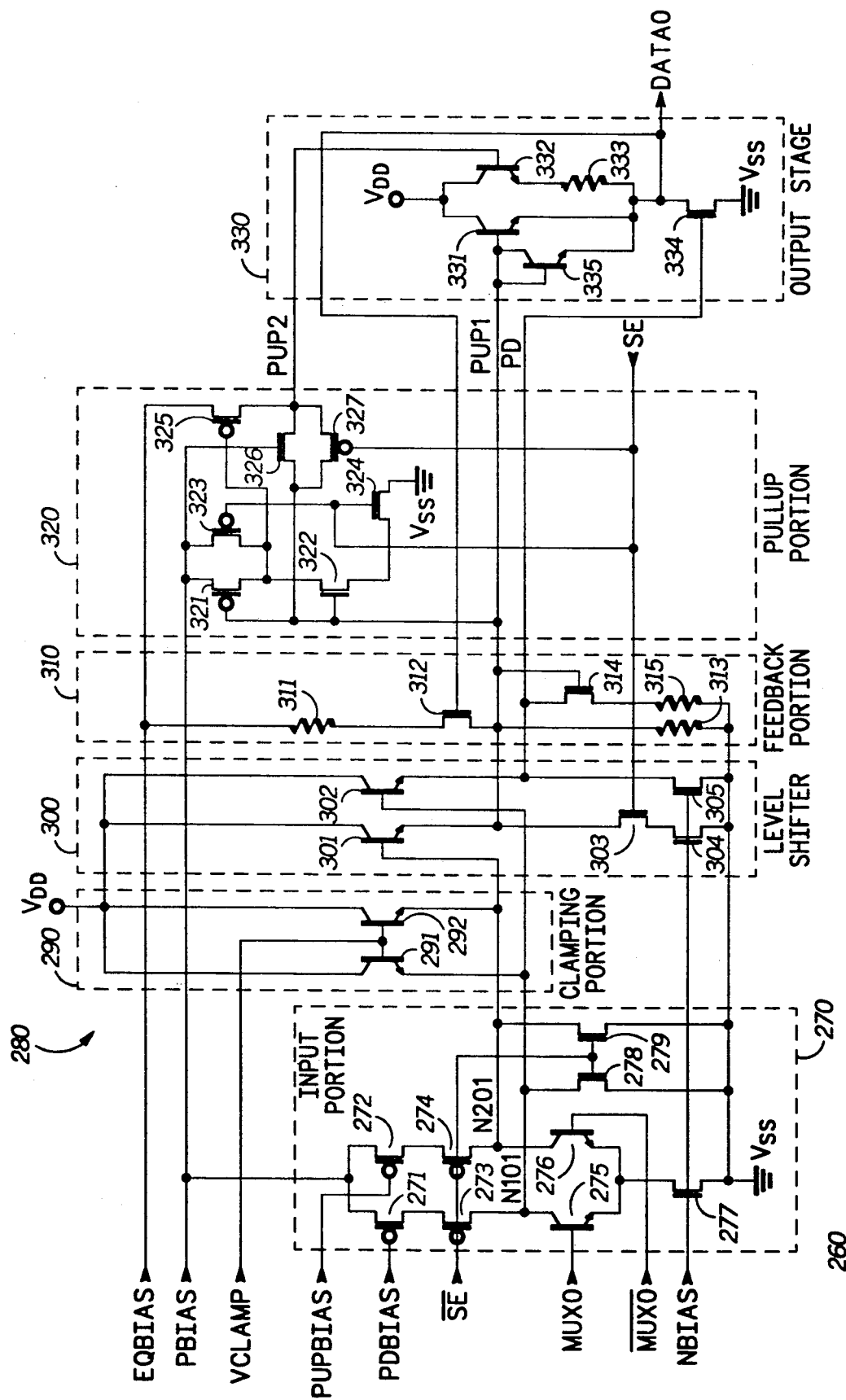
FIG. 10 illustrates in schematic form an output buffer circuit in accordance with the present invention.

FIG. 10 illustrates in schematic form an output buffer circuit 260 in accordance with the present invention. Output buffer circuit 260 comprises generally an input portion 270, and an output portion 280. Input portion 270 comprises P-channel transistors 271-274, NPN transistors 275 and 276, and N-channel transistors 277-279. Output portion 280 comprises generally a clamping portion 290, a level shifter 300, a feedback portion 310, a pullup portion 320, and an output stage 330. Clamping portion 290 comprises NPN transistors 291 and 292. Level shifter 300 comprises NPN transistors 301 and 302, and N-channel transistors 303-305. Feedback portion 310 comprises a resistor 311, an N-channel transistor 312, a resistor 313, an N-channel transistor 314, and a resistor 315. Pullup portion 320 comprises a P-channel transistor 321, an N-channel transistor 322, a P-channel transistor 323, an N-channel transistor 324, a P-channel transistor 325, an N-channel transistor 326, and a P-channel transistor 327. Output stage 330 comprises NPN transistors 331 and 332, a resistor 333, an N-channel transistor 334, and an NPN transistor 335.

In input stage 270, transistor 271 has a source for receiving a bias voltage labelled "PBIAS", a gate for receiving a bias voltage labelled "PDBIAS", and a drain. Transistor 272 has a source for receiving PBIAS, a gate for receiving a bias signal labelled "PUPBIAS", and a drain. Transistor 273 has a source connected to the drain of transistor 271, a gate for receiving a select signal labelled "$\overline{\text{SE}}$", and a drain connected to a node labelled "N101". Transistor 274 has a source connected to the drain of transistor 272, a gate for receiving $\overline{\text{SE}}$, and a drain connected to a node labelled "N201". Transistor 275 has a collector connected to the drain of transistor 273 at node N101, a base for receiving signal MUX0, and an emitter. Transistor 276 has a collector connected to the drain of transistor 274 at node N201, a base for receiving signal $\overline{\text{MUX0}}$, and an emitter connected to the emitter of transistor 275. Note that signals MUX0 and $\overline{\text{MUX0}}$ are level shifted from signals MUX0 and $\overline{\text{MUX0}}$ of FIG. 9 through circuitry not shown; however, these signals retain their designation for ease of illustration. Transistor 277 has a drain connected to the emitters of transistors 275 and 276, a gate for receiving bias signal NBIAS, and a source connected to $V_{SS}$. Transistor 278 has a drain connected to node N101, a gate for receiving signal $\overline{\text{SE}}$, and a source connected to $V_{SS}$. Transistor 279 has a drain connected to node N201, a gate for receiving signal $\overline{\text{SE}}$, and a source connected to $V_{SS}$.

In clamping portion 290, transistor 291 has a collector connected to $V_{DD}$, a base for receiving a clamping reference voltage labelled "VCLAMP", and an emitter connected to node N101. Transistor 292 has a collector connected to $V_{DD}$, a base for receiving VCLAMP, and an emitter connected to node N201.

In level shifter 300, transistor 301 has a collector connected to $V_{DD}$, a base connected to node N201, and an emitter for providing a pullup signal labelled "PUP1". Transistor 302 has a collector connected to $V_{DD}$, a base connected to node N101, and an emitter for providing a pulldown signal labelled "PD". Transistor 303 has a drain connected to the emitter of transistor 301, a gate for receiving a select signal labelled "SE", and a source. Transistor 304 has a drain connected to the source of transistor 303, a gate for receiving signal NBIAS, and a source connected to $V_{SS}$. Transistor 305 has a drain connected to the emitter of transistor 302, a gate for receiving signal NBIAS, and a source connected to $V_{SS}$.

In feedback portion 310, resistor 311 has a first terminal connected to signal EQBIAS, and a second terminal. Transistor 312 has a drain connected to the second terminal of resistor 311, a gate for receiving an output data signal labelled "DATA0", and a source connected to the emitter of transistor 301. Resistor 313 has a first terminal connected to the source of transistor 312, and a second terminal connected to $V_{SS}$. Transistor 314 has a drain connected to the emitter of transistor 302, a gate for receiving signal PUP1, and a source. Resistor 315 has a first terminal connected to the source of transistor 314, and a second terminal connected to $V_{SS}$.

In pullup portion 320, transistor 321 has a source for receiving signal PBIAS, a gate for receiving signal PUP1, and a drain. Transistor 322 has a drain connected to the drain of transistor 321, a gate for receiving signal PUP1, and a source. Transistor 323 has a source for receiving signal PBIAS, a gate for receiving signal SE, and a drain connected to the drain of transistor 321. Transistor 324 has a drain connected to the source of transistor 322, a gate for receiving signal SE, and a source connected to $V_{SS}$. Transistor 325 has a source for receiving signal EQBIAS, a gate connected to the drains of transistors 321 and 323, and a drain for providing a pullup signal labelled "PUP2". Transistor 326 has a drain connected to the drain of transistor 325, a gate for receiving signal PBIAS, and a source connected to the first terminal of resistor 313. Transistor 327 has a source connected to the drain of transistor 325, a gate for receiving signal SE, and a drain connected to the first terminal of resistor 313. Note that the designation of source and drain for transistors 327 and 327 is arbitrary and which current electrode becomes source and drain depends on the voltages applied.

In output stage 330, transistor 331 has a collector connected to $V_{DD}$, a base for receiving signal PUP1, and an emitter for providing signal DATA0. Transistor 332 has a collector connected to $V_{DD}$, a base for receiving signal PUP2, and an emitter. Resistor 333 has a first terminal connected to the emitter of transistor 332, and a second terminal connected to the emitter of transistor 331. Transistor 334 has a drain connected to the emitter of transistor 331, a gate for receiving signal PD, and a source connected to $V_{SS}$. Transistor 335 has both a collector and a base connected to the base of transistor 331, and an emitter connected to the emitter of transistor 331.

To understand the operation of output buffer circuit 260, it is desirable first to understand the operation of each portion individually. Input portion 270 receives a data signal represented as a differential voltage between signals MUX0 and $\overline{\text{MUX0}}$. In response, input portion 270 provides voltages on nodes N101 and N201. In response to a positive (negative) differential voltage between MUX0 and $\overline{\text{MUX0}}$, input portion provides a positive (negative) voltage differential between nodes N201 and N101. Input portion 270 is thus a differential voltage amplifier, with node N201 being the positive output terminal of the amplifier, and node N101 being the negative output terminal of the amplifier. Signals PDBIAS and PUPBIAS respectively bias transistors 271 and 272 to operate as current sources. In addition, signal NBIAS is chosen to bias N-channel transistor 277 to operate as a current source. The current provided by transistor 277 is greater than the sum of currents of both transistors 271 and 272. Thus, the gain of input stage 270 is large, and a small differential voltage developed between MUX0 and $\overline{\text{MUX0}}$ is reflected as a large differential voltage between nodes N201 and N101. Another effect of a large current provided by transistor 277 in relation to those of transistors 271 and 272 is that if the voltage difference between signals MUX0 and $\overline{\text{MUX0}}$ is indeterminate, then neither the voltage at node N101 nor the voltage at node N201 is a logic high. When both N101 and N201 are at a logic low, DATA0 is provided in a high impedance state, as will be seen later. Keeping the voltages at nodes N101 and N201 at a logic low when the differential voltage between MUX0 and $\overline{\text{MUX0}}$ is indeterminate also prevents large currents which would flow if transistors 331 or 332, and transistor 334, in output stage 330 were simultaneously conductive. This phenomenon is known as crowbarring.

It should be apparent that other types of current sources are possible instead of those formed by MOS transistors. However, using MOS transistors has an advantage over using comparable bipolar transistors because MOS transistors require no appreciable gate current from the corresponding bias signal, whereas the comparable bipolar transistors do require an appreciable base current. Furthermore MOS transistors allow greater drain-to-source operating voltage ranges than corresponding collector-to-emitter operating voltage ranges for comparable bipolar transistors.

The use of separate bias signals PDBIAS and PUPBIAS allows the voltages on nodes N101 and N201, and thus the voltages of signals PD and PUP1, to be independently varied to maximize the speed of output buffer 260 while maintaining minimum di/dt. Since the gain of the amplifier is made large by proper sizing of transistors 271, 272, and 277, the output high voltage at node N201 or N101 is approximately PBIAS. In the illustrated embodiment, PBIAS is about 3.5 volts. Input portion 270 also comprises a select feature. When $\overline{\text{SE}}$ is a logic high, input portion 270 is disabled in three ways.

First, transistors 273 and 274 disable any current flow through their respective circuit branches. Second, transistors 278 and 279 become conductive and couple nodes N201 and N101 substantially to $V_{SS}$. Coupling both nodes N201 and N101 to $V_{SS}$, in conjunction with reducing VCLAMP to approximately $V_{SS}$, places output signal DATA0 in the high-impedance state. Third, signals MUX0 and $\overline{\text{MUX0}}$ are both provided at a logic low (by circuitry not shown) when output buffer 260 is not selected to prevent transistors 275 and 276 from saturating.

Input portion 270 in conjunction with output portion 280 provides an improvement over known output buffer circuits by quickly developing signal voltages on nodes N101 and N201 while maintaining an acceptable level of di/dt. Signal voltages are developed by the use of bipolar transistors 275 and 276, which generally switch faster than MOS transistors. Current sources formed by transistors 271 and 272 provide first and second currents from a constant, regulated voltage PBIAS to output nodes N201 and N101, respectively. The limitation of current provided by nodes N101 and N201 ultimately limits the rate at which transistors 331, 332, 334, and 335 become conductive, thereby lessening di/dt.

The use of current sources in input portion 270 also provides an improvement over the use of resistors, a known technique in di/dt control. In integrated circuits, resistors are normally formed by diffusions of one conductivity type in the semiconductor substrate of the opposite conductivity type. Current in the resistor is conducted by the majority carrier. Since the resistor's resistive value is directly proportional to its length for a given conductivity of the diffusion region and inversely proportional to its width, the resistive value is chosen by forming the resistor with a particular size. The resistive value of the resistor is sensitive to diffusion times, and to the physical formation from masking and etching, and thus integrated circuit resistors are highly sensitive to process variations. However, current sources formed by MOS transistors biased into saturation are relatively insensitive to integrated circuit processing variations, and provide a more stable current limitation.

Furthermore, a diffused resistor forms a PN junction with the substrate which is normally reverse biased. A leakage current develops along the junction. Since the voltage varies along the length of the resistor, the size of the depletion region also varies. Since the current is conducted in the resistor by majority carriers, where the depletion region is largest, the resistance is the greatest. Thus the resistance of the diffused resistor varies with the voltage applied. However, the drain-to-source current ($I_{DS}$) provided by an MOS transistor biased into saturation is, for the most part, independent of the drain-to-source voltage ($V_{DS}$).

In output portion 280, clamping portion 290 determines the logic low voltage on nodes N101 and N201. Reference voltage VCLAMP assures that voltages on nodes N101 and N201 do not drop below (VCLAMP$-V_{BE}$). When output buffer circuit 260 is not selected, VCLAMP is provided as $V_{SS}$. As the voltage on either node N101 or node N201, or both, approaches (VCLAMP$-V_{BE}$), the base-emitter diode of transistor 291 or 292 starts to conduct in the forward direction, thus preventing the corresponding voltage from dropping further. Nodes N201 and N101 thus have logic high and logic low voltages of PBIAS and (VCLAMP$-V_{BE}$), respectively. Transistors 291 and 292 also prevent transistors 275 and 276 in input portion 270 from saturating due to the high gain of input portion 260.

Level shifter 300 decreases the voltages at nodes N201 and N101 by a predetermined amount, namely $V_{BE}$, to provide signals PUP1 and PD. Because there may be large routing capacitance and large capacitance on the base of transistor 331 and the gate of transistor 334, it is advantageous to isolate nodes N201 and N101 therefrom. Level shifter 300 allows input stage 270 to avoid switching large amounts of current required to driver large capacitive loads. Level shifter 300 switches current more efficiently than input stage 270, thus saving overall current.

Transistors 304 and 305 function as current sources to control the rate at which PUP1 and PD become inactive, thereby controlling di/dt during the time when transistors 331 or 334 become nonconductive. Using MOS current sources formed by transistors 304 and 305 to reduce the voltage on signals PUP1 and PD offers an improvement over the use of resistors or common logic gates. When the voltage on the base of transistor 301 or 302 drops, the current sources formed by transistors 304 and 305 ensure that respective emitter voltages PUP1 or PD are quickly reduced. The voltages on the emitters of transistors 301 and 302, signals PUP1 and PD, are each one $V_{BE}$ below the voltages on the respective bases. Thus, disregarding feedback portion 310, PUP1 and PD are signals with a logic high voltage of (PBIAS$-V_{BE}$), and a logic low voltage of (VCLAMP$-2V_{BE}$). Level shifter 300 provides an additional feature. Transistor 303 is conductive only when signal SE is an active high, and thus prevents signal PUP1 from being coupled to $V_{SS}$ when output buffer circuit 260 is not selected.

Feedback portion 310 comprises two circuit branches which help to control di/dt during switching of output buffer circuit 260. A first circuit branch, comprising resistor 311, transistor 312, and resistor 313, provides a voltage on PUP1 in response to signal DATA0 exceeding signal PUP1 by at least one N-channel threshold ($V_T$). This occurs when output buffer circuit 260 is deselected and a logic high voltage exists on signal DATA0, either from a previous cycle in which output buffer circuit 260 is selected and provides a logic high, or from a second device besides memory 30 providing signal DATA0 as a logic high. Transistor 312 becomes conductive, and under typical operating conditions the voltage of PUP1 is determined by voltage division between resistors 311 and 313, but in no case will PUP1 be below (DATA0$-V_T$). The voltage of PUP1, when DATA0 exceeds PUP1 by at least $V_T$, can be made large enough so that the reverse bias on the base-emitter junctions of transistors 331 and 335 is small enough to assure a predetermined mean lifetime of transistors 331 and 335. Thus, the first circuit branch in feedback portion 310 improves reliability.

The second circuit branch comprises transistor 314 and resistor 315. When signal PUP1 is a logic high voltage, signal PD is coupled through resistor 315 to $V_{SS}$. Since a large capacitance is coupled to the gate of transistor 334, resistor 315 decreases the rate at which transistor 334 becomes nonconductive, thus decreasing di/dt. Note that since transistor 334 is an MOS transistor, no reverse bias base-emitter junction problem is present and the logic low voltage of PD may be approximately $V_{SS}$ without causing a reliability problem.

Pullup portion 320 provides pullup signal PUP2 to output stage 330 at a second, higher logic high output level than signal PUP1. Pullup portion 320 provides DATA0 at a desired output high voltage, and compensates for the fact that level shifter 300 reduces the voltage of N201 by one $V_{BE}$. Pullup portion 320 provides signal PUP2 as a logical AND between signals PUP1 and SE. When SE is a logic high, transistor 327 is nonconductive. Transistor 324 becomes conductive, and transistors 321 and 322 function as an inverter. If signal PUP1 switches to a logic high, transistor 326 is initially conductive to increase the voltage of PUP2 to approximately that of PUP1. The voltage on the drain of transistor 321 becomes a logic low, making transistor 325 conductive, and making transistor 321 nonconductive as transistor 325 raises the source voltage of transistor 326. PUP2 is thus provided at a logic high voltage of approximately EQBIAS, about 4.2 volts, which is higher than the logic high voltage of PUP1 by about ($2V_{BE}$). If signal PUP1 is a logic low, the voltage on the gate of transistor 325 is a logic high voltage, making transistor 325 nonconductive. Transistor 326 is then conductive to provide PUP2 as a logic low at approximately the voltage of PUP1.

When signal SE is a logic low, transistor 324 is nonconductive, and transistor 323 is conductive and couples the drain of transistor 321 to a logic high voltage, keeping transistor 325 nonconductive. Since signals $\overline{SE}$ and SE are logical complements, signal $\overline{SE}$ is also inactive. When $\overline{SE}$ is inactive, transistor 278 provides signal PD as a logic low. In addition, transistor 279 reduces the voltage on the base of transistor 301 to approximately $V_{SS}$. Signal SE makes transistor 303 nonconductive to prevent the base of transistor 331 from being strongly coupled to $V_{SS}$ through relatively-large transistor 304. It is important not to couple PUP1 to $V_{SS}$ because a large reverse bias would be developed across the base-emitter junction of transistors 331 and 335. When output buffer 260 is not selected and DATA0 is a logic high, the voltage of PUP1 is determined by voltage division between resistors 311 and 313. If DATA0 is provided as a logic low, the voltage of PUP1 is reduced through the base-emitter diode of transistor 335. Then, if DATA0 is provided as a logic high, feedback portion 310 increases the voltage of PUP1. This voltage is chosen to maximize the expected mean lifetime of transistors 331 and 335, and transistor 301. A higher voltage on PUP1 improves the reverse bias on transistor 331, whereas a lower voltage on PUP1 improves the reverse bias on transistor 301. Thus, an optimum PUP1 voltage can be chosen. Transistors 326 and 327 are both conductive to provide signal PUP2 as a logic low. When signals PUP1, PUP2, and PD are all a logic low, all transistors in ouput stage 330 are nonconductive and DATA0 is provided in the high impedance state.

It is helpful at this point to review each signal provided as an input to output stage 330 when output buffer circuit 260 is selected. Pullup signal PUP1 is provided at a logic high voltage of ($PBIAS-V_{BE}$), or about 2.8 volts, and a logic low voltage of ($VCLAMP-2V_{BE}$). Pullup signal PUP2 is provided at a logic high voltage of EQBIAS (or about 4.2 volts), and a logic low voltage of ($VCLAMP-2V_{BE}$). Pulldown signal PD is provided at a logic high voltage of ($PBIAS-V_{BE}$), and a logic low voltage of ($VCLAMP-2V_{BE}$).

When the differential voltage between MUX0 and $\overline{MUX0}$ changes from a logic low to a logic high, PUP1 and PUP2 are each at their respective logic high voltages. Assuming DATA0 is at a logic low, transistor 331 is biased in the active region to quickly provide a large current to a highly capacitive load (not shown) coupled to the emitter of transistor 331. Signal DATA0, which is one of the plurality of signals designated as "DATA" in FIG. 2, is provided to a bonding pad of an integrated circuit (not shown). The bonding pad is coupled to a lead frame through a bond wire. Ultimately the lead frame contacts or is soldered to a circuit board. Thus, there is a large capacitance at the emitter of transistor 331 and it is advantageous for transistor 331 to be biased in the active region in order to quickly switch as much current as possible for a specified amount of di/dt. The voltage of DATA0 quickly rises to ($PUP1-V_{BE}$), which equals ($PBIAS-2V_{BE}$).

The large capacitive load coupled to the emitter of transistor 331 tends to cause the base of transistor 331 to self boost due to the large base-emitter junction capacitance that exists when the base-emitter voltage becomes large. Self boosting is harmful to the operation of output buffer circuit 260, because if the actual logic high voltage of DATA0 exceeds the desired logic high voltage, an additional delay is incurred if DATA0 switches to a logic low during a subsequent cycle. Transistor 335 helps prevent self-boosting on transistor 331 by providing a discharge path for the base of transistor 331 through the base-emitter diode of transistor 335.

In response to PUP1 switching to a logic high, PUP2 is provided at a logic high, making transistor 332 conductive. Transistor 332 eventually raises the voltage on DATA0 to approximately ($PUP2-V_{BE}$), or approximately ($EQBIAS-V_{BE}$). The logic high voltage of DATA0, however, must be chosen to meet, but not greatly exceed, specification, since greatly exceeding specification has the effect of reducing speed and increasing di/dt. Thus the value of resistor 333 is chosen to provide DATA0 at the specified logic high voltage plus a suitable margin when a specified output high current is provided.

Figure 11:
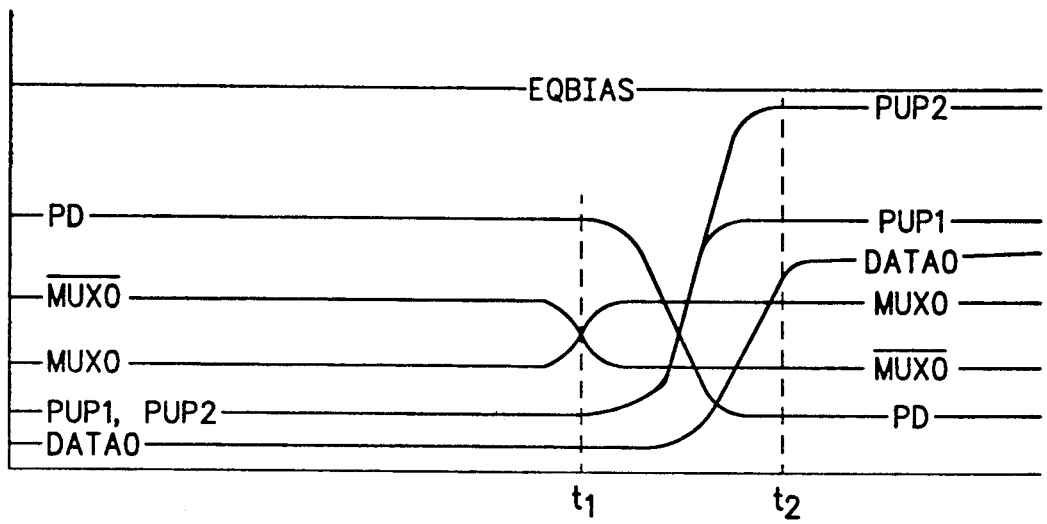
FIG. 11 illustrates a timing diagram of some of the signals of the output buffer of FIG. 10 when a data output signal changes from a logic low to a logic high.
Figure 12:
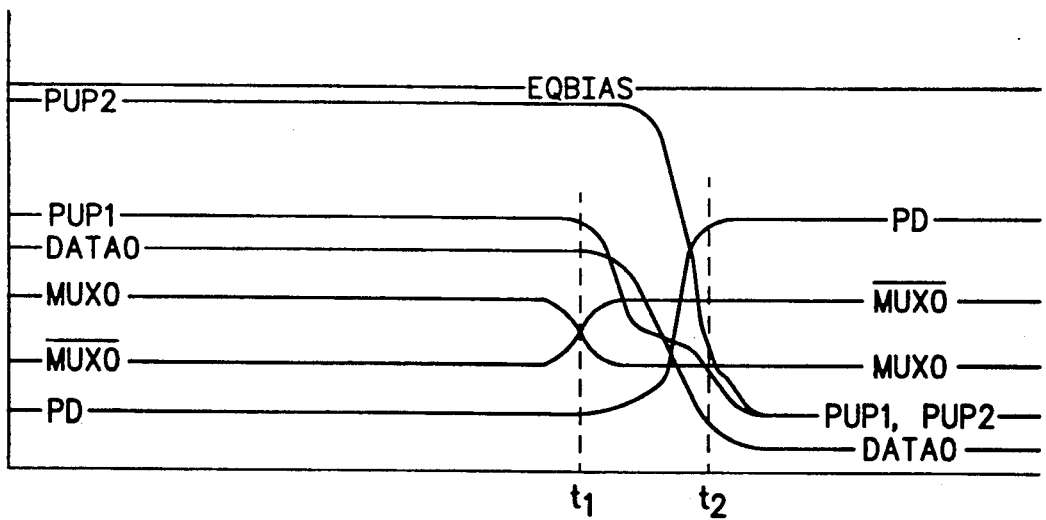
FIG. 12 illustrates another timing diagram of the signals of FIG. 10 when the data output signal changes from a logic high to a logic low.

FIG. 11 illustrates a timing diagram where the differential voltage between MUX0 and $\overline{MUX0}$ changes from a logic low to a logic high. In FIG. 11, the vertical axis represents voltage, and the horizontal axis represents time. Around a time labelled "t1", the differential voltage between MUX0 and $\overline{MUX0}$ changes from a logic low to a logic high. Note that the differential voltage between MUX0 and $\overline{MUX0}$ is relatively small, less than one volt. In response to the change in voltage of MUX0 and $\overline{MUX0}$, PUP1 and PUP2 change from a logic low to a logic high. The logic high voltage of PUP2, however, is above that of PUP1. In the illustrated embodiment, EQBIAS is 4.2 volts, PBIAS is 3.5 volts, the logic high voltage of PUP2 is approximately EQBIAS (4.2 volts), and the logic high voltage of PUP1 is about ($PBIAS-V_{BE}$), or 2.8 volts. In response to PUP1 and PUP2 being a logic high, and to PD reaching a logic low, illustrated at about a time labelled "t2", DATA0 changes from a logic low to a logic high. In FIG. 12, when the input voltage between MUX0 and $\overline{MUX0}$ changes from a logic high to a logic low, PUP1 and PUP2 each change to a logic low voltage. A differential voltage between MUX0 and $\overline{MUX0}$ changes from a logic high to a logic low around a time labelled "t1". In response, PUP1 and PUP2 begin to drop in voltage.

Output buffer circuit 260 of FIG. 10 presents an improvement over known output buffer circuits. First, input portion 270 controls the rate at which the output transistors become conductive by providing a regulated voltage applied to current sources which are switched in response to the input differential voltage, thus decreasing di/dt. Second, bipolar transistors are used in the critical speed path to begin switching the output signal at the earliest possible moment. Third, two pullup signals are utilized; one is provided first at a first predetermined logic high voltage, and another is subsequently provided at a second predetermined logic high voltage, the second predetermined voltage being higher than the first predetermined voltage. Fourth, a feedback portion controls the maximum reverse bias on output stage transistors, and provides desirable output signal control on signal PD for minimum switching time and minimum di/dt. Fifth, the output stage comprises two bipolar transistors connected essentially in parallel having bases coupled respectively to the first and second pullup signals, in series with an N-channel MOS transistor having a gate for receiving the pulldown signal. The second bipolar transistor has its emitter coupled to the output signal through a resistor to maintain an output signal at approximately a specified output high voltage while providing a specified output high current. Sixth, third bipolar transistor is coupled between the base and the emitter of the first bipolar transistor to prevent undesirable self-boosting at the base of the first bipolar transistor.

Figure 13:
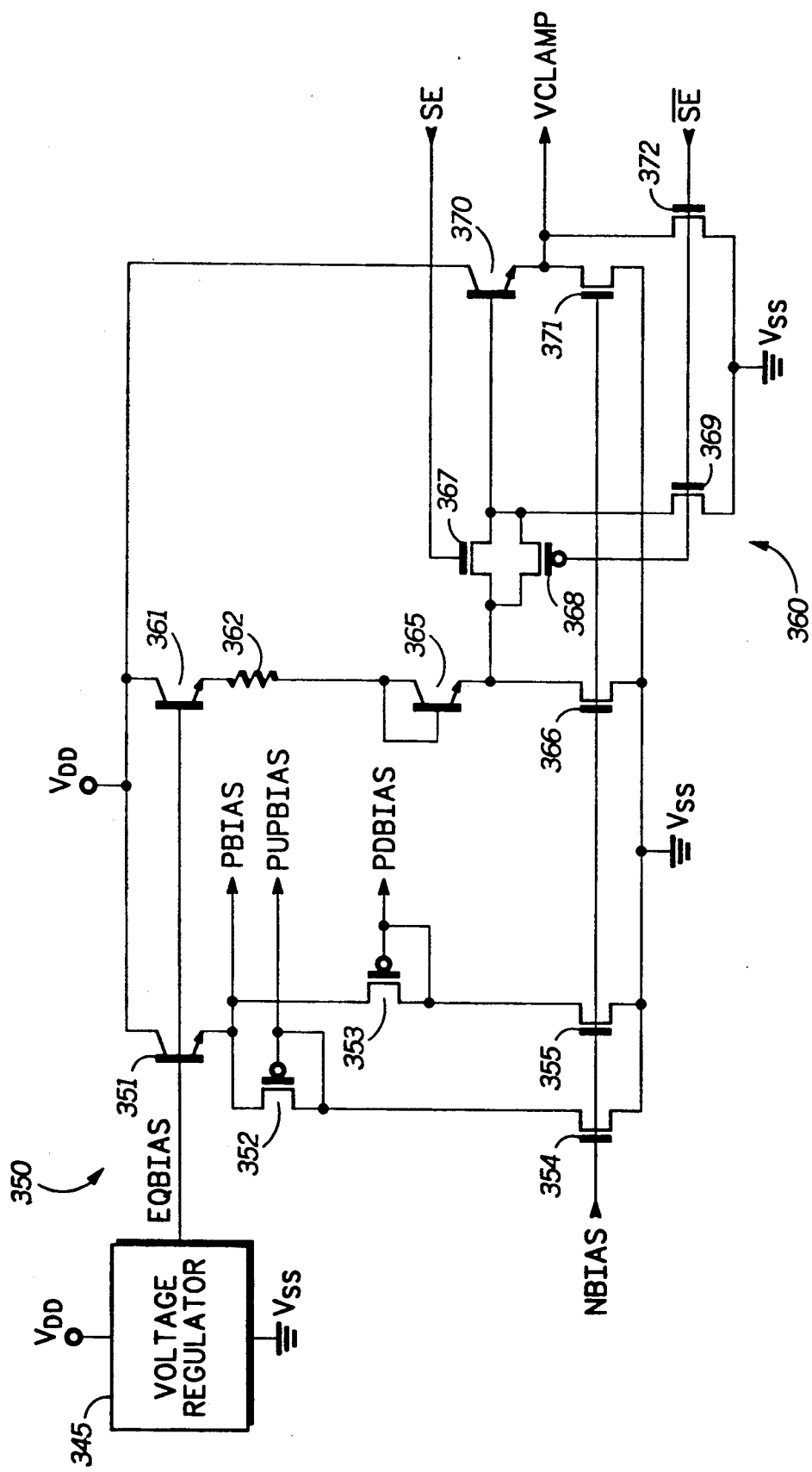
FIG. 13 illustrates in schematic form a circuit which provides the control signals and regulated voltage for the circuit of FIG. 10.

FIG. 13 illustrates in schematic form a circuit 340 to generate the control signals and regulated voltage for output buffer circuit of FIG. 10. Circuit 340 comprises generally a voltage regulator 345 a bias portion 350, and a clamp portion 360. Bias portion 350 comprises an NPN transistor 351, P-channel transistors 352 and 353, and N-channel transistors 354 and 355. Clamp portion 360 comprises an NPN transistor 361, a resistor 362, an NPN transistor 365, N-channel transistors 366 and 367, a P-channel transistor 368, an N-channel transistor 369, an NPN transistor 370, and N-channel transistors 371 and 372.

Voltage regulator 345 is connected to $V_{DD}$ and $V_{SS}$ and provides signal EQBIAS substantially independent of power supply voltage fluctuations, at approximately 4.2 volts. In bias portion 350, transistor 351 has a collector connected to $V_{DD}$, a base for receiving signal EQBIAS, and an emitter for providing signal PBIAS. Transistor 352 has a source connected to the emitter of transistor 351, a gate, and a drain connected to the gate of transistor 352 and providing signal PUPBIAS. Transistor 353 has a source connected to the emitter of transistor 351, a gate, and a drain connected to the gate of transistor 353 and providing signal PDBIAS. Transistor 354 has a drain connected to the drain of transistor 352, a gate for receiving signal NBIAS, and a source connected to $V_{SS}$. Transistor 355 has a drain connected to the drain of transistor 353, a gate for receiving signal NBIAS, and a source connected to $V_{SS}$.

In clamp portion 360, transistor 361 has a collector connected to $V_{DD}$, a base for receiving signal EQBIAS, and an emitter. Resistor 362 has a first terminal connected to the emitter of transistor 361, and a second terminal. Transistor 365 has a collector connected to the second terminal of resistor 362, a base connected to the collector of transistor 365, and an emitter. Transistor 366 has a drain connected to the emitter of transistor 365, a gate for receiving signal NBIAS, and a source connected to $V_{SS}$. Transistor 367 has a drain connected to the emitter of transistor 365, a gate for receiving signal SE, and a source. Transistor 368 has a source connected to the emitter of transistor 365, a gate for receiving signal $\overline{SE}$, and a drain connected to the source of transistor 367. Transistor 369 has a drain connected to the source of transistor 367 and to the drain of transistor 368, a gate for receiving signal $\overline{SE}$, and a source connected to $V_{SS}$. Transistor 370 has a collector connected to $V_{DD}$, a base connected to the source of transistor 367 and to the drain of transistor 368, and an emitter for providing signal VCLAMP. Transistor 371 has a drain connected to the emitter of transistor 370, a gate for receiving signal NBIAS, and a source connected to $V_{SS}$. Transistor 372 has a drain connected to the emitter of transistor 370, a gate for receiving signal $\overline{SE}$, and a source connected to $V_{SS}$.

In operation, bias portion 350 provides the bias signals PBIAS, PUPBIAS, and PDBIAS. Signal PBIAS is equal to (EQBIAS $-V_{BE}$), or about 3.5 volts. Since PBIAS is equal to a constant signal EQBIAS minus a predetermined amount ($V_{BE}$), PBIAS itself is a regulated signal substantially independent of power supply voltage fluctuations. Signals PUPBIAS and PDBIAS are provided in response to substantially fixed currents flowing through transistors 352 and 353, respectively. PUPBIAS and PDBIAS are provided in response to the relative sizes of transistors 352 and 354, and 353 and 355, respectively. While PUPBIAS and PDBIAS need not be different voltages, bias portion 350 allows a difference to be provided if the sizes of transistors 352-355 are appropriately altered.

In clamping portion 360, transistor 366 provides a bias current for transistors 361 and 365 to set a voltage at the emitter of transistor 365. The voltage is approximately equal to (EQBIAS $-2V_{BE}$), or about 2.8 volts; however, resistor 362 allows fine tuning of the voltage at the emitter of transistor 365. If the resistance of resistor 362 is increased, the voltage at the emitter of the transistor 365 is decreased. Transistors 367 and 368 are conductive only when signals SE and $\overline{SE}$ are active, and provide a voltage on the base of transistor 370 approximately equal to the voltage at the emitter of transistor 365. Transistor 371 biases transistor 370 to provide voltage VCLAMP. Transistor 370 further decreases the voltage at the emitter of transistor 365 by one $V_{BE}$. Thus, if the effect of resistor 362 is ignored, VCLAMP is equal to (EQBIAS $-3V_{BE}$), or approximately 2.1 volts. Finally, transistor 372 couples reference voltage VCLAMP to $V_{SS}$ when $\overline{SE}$ is inactive. Without VCLAMP being provided at $V_{SS}$ when $\overline{SE}$ is inactive, the action of transistors 278 and 279 would be insufficient to couple nodes N101 and N201 substantially to $V_{SS}$.

It should be apparent by now that an output buffer circuit has been described with low di/dt and improved speed. The output buffer circuit improves speed by using bipolar transistors in the critical speed path. The improved speed of the bipolar transistors over MOS transistors by itself could lead to a worsening of di/dt. Di/dt is controlled in part through the input stage, which comprises a current source providing a constant current from a regulated voltage to first and second nodes. Two transistors receive a differential voltage and provide voltages on the first and second nodes in response to the differential voltage between two input signals. The current source prevents the subsequent bipolar transistors from switching the output signal too quickly by limiting the current provided by the first and second nodes. Transistor current sources are more tolerant of process variations than resistors which are available to typical integrated circuit processes.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. An output buffer comprising:
   a voltage regulator, coupled to first and second power supply voltage terminals, for providing a regulated voltage characterized as having a constant voltage substantially independent of fluctuations in voltage between said first power supply voltage terminal and said second power supply voltage terminal;
   first and second current sources, each coupled to said voltage regulator, for providing first and second currents from said voltage regulator, respectively, to first and second nodes;
   switching means, coupled to said first and second current sources, for providing voltage signals at said first and second nodes respectively in response to positive and negative voltage differences between first and second input voltages;
   a third current source, having a first terminal coupled to said switching means, and a second terminal coupled to said second power supply voltage terminal;
   output means, coupled to said first and second nodes, for providing an output signal at a logic high voltage in response to said voltage signal at said first node, and for providing said output signal as a logic low voltage in response to said voltage signal at said second node.

2. The output buffer of claim 1 wherein said switching means comprises:
   a first transistor, having a first current electrode coupled to said first node, a control electrode for receiving said second input voltage, and a second current electrode coupled to said third current source; and
   a second transistor having a first current electrode coupled to said second node, a control electrode for receiving said first input voltage, and a second current electrode coupled to said second current electrode of said first transistor.

3. The output buffer of claim 2 wherein said first and second transistors are bipolar transistors.

4. The output buffer of claim 2 wherein a current provided by said current source exceeds a sum of both said first current and said second current.

5. The output buffer of claim 1 wherein said output means comprises:
   clamping means, coupled to said first and second nodes, for maintaining a predetermined minimum voltage on said first and second nodes;
   pullup means for providing a first signal in response to said voltage at said first node, a logic high voltage of said first signal exceeding a logic high voltage of said voltage at said first node by a predetermined voltage; and
   an output stage for providing said output signal at either a logic high voltage in response to either said first signal or to said voltage at said first node, or a logic low voltage in response to said voltage at said second node.

6. The output buffer of claim 1 wherein said output means comprises:
   clamping means, coupled to said first and second nodes, for maintaining a predetermined minimum voltage on said first and second nodes;
   level shift means, coupled to said first and second nodes, for providing a first signal at said voltage of said first node minus a first predetermined voltage, and for providing a second signal at said voltage of said second node minus a second predetermined voltage;
   pullup means for providing a third signal in response to said first signal, a logic high voltage of said third signal exceeding a logic high voltage of said first signal by a third predetermined voltage; and
   an output stage, coupled to said level shifter, for providing said output signal at either a logic high voltage in response to said first and third signals, or a logic low voltage in response to said second signal.

7. The output buffer of claim 6 wherein said output stage comprises:
   a first transistor having a collector coupled to said first power supply voltage terminal, a base for receiving said first signal, and an emitter for providing said output signal;
   a second transistor having a collector coupled to said first power supply voltage terminal, a base for receiving said third signal, and an emitter;
   a resistor having a first terminal coupled to said emitter of said second transistor, and a second terminal coupled to said emitter of said first transistor; and
   a third transistor having a first current electrode coupled to said emitter of said first transistor, a control electrode for receiving said second signal, and a second current electrode coupled to said second power supply voltage terminal.

8. The output buffer of claim 7 further comprising a fourth transistor having both a collector and a base coupled to said base of said first transistor, and having an emitter coupled to said emitter of said first transistor.

9. The output buffer of claim 6 further comprising feedback means coupled to said level shifter and to said output stage, for maintaining said first and third signals at substantially a second predetermined minimum voltage in response to a select signal.

10. The output buffer of claim 9 wherein said feedback means comprises:
   a first resistor having a first terminal coupled to said first power supply voltage terminal, and a second terminal;
   a transistor having a first current electrode coupled to said second terminal of said first resistor, a control electrode for receiving said output signal, and a second current electrode for providing said first signal; and
   a second resistor having a first terminal coupled to said second current electrode of said transistor, and a second terminal coupled to said second power supply voltage terminal.

11. An output buffer coupled to first and second power supply voltage terminals comprising:
   input means for either, providing first and second signals in response to a voltage difference between true and complementary input voltages, or for providing said first and second signals at the second power supply voltage in response to a select signal;

clamp means, coupled to said input means, for clamping said first and second signals at a first predetermined minimum voltage;

a level shifter, coupled to said input means, for providing third and fourth signals respectively at voltages of said first and second signals minus a predetermined voltage;

feedback means, coupled to said level shifter, for maintaining said first and third signals at a second predetermined minimum voltage in response to said select signal;

pullup means for providing a fifth output signal in response to said third signal; and output stage means for providing a data output signal at a data output node, said output stage means providing said data output signal at a logic high voltage in response to at least one of said third signal and said fifth signal, and for providing said data output signal at a logic low voltage in response to said fourth signal.

12. The output buffer of claim 11 wherein said output means comprises:

a first transistor having a collector coupled to the first power supply voltage terminal, a base for receiving said third signal, and an emitter for providing said data output signal;

a second transistor having a collector coupled to the first power supply voltage terminal, a base for receiving said fifth output signal, and an emitter;

a resistor having a first terminal coupled to said emitter of said second transistor, and a second terminal coupled to said emitter of said first transistor; and a third transistor having a first current electrode coupled to said emitter of said first transistor, a control electrode for receiving said fourth signal, and a second current electrode coupled to the second power supply voltage terminal.

13. The output buffer of claim 12 wherein said output means further comprises a fourth transistor having both a collector and a base coupled to said base of said first transistor, and an emitter coupled to said emitter of said first transistor.

14. The output buffer of claim 11 wherein said input means comprises:

a first transistor having a first current electrode coupled to a reference voltage terminal, a control electrode for receiving a first bias voltage, and a second current electrodes;

a second transistor having a first current electrode coupled to said reference voltage terminal, a control electrode for receiving a second bias signal, and a second current electrode;

a third transistor having a first current electrode coupled to said second current electrode of said first transistor, a control electrode for receiving said select signal, and a second current electrode for providing said second signal;

a fourth transistor having a first current electrode coupled to said second current electrode of said second transistor, a control electrode for receiving said select signal, and a second current electrode for providing said first signal;

a fifth transistor having a first current electrode coupled to said second current electrode of said third transistor, a control electrode for receiving said true input voltage, and a second current electrode;

a sixth transistor having a first current electrode coupled to said second current electrode of said fourth transistor, a control electrode for receiving said complementary input signal, and a second current electrode coupled to said second current electrode of said fifth transistor; and a current source coupled to said second current electrodes of said fifth and sixth transistors, for providing a predetermined current from said second current electrodes of said fifth and sixth transistors to the second power supply voltage terminal.

15. The output buffer of claim 14 wherein said fifth and sixth transistors are each bipolar transistors.

16. The output buffer of claim 11 wherein said level shifter comprises:

a first transistor having a collector coupled to the first power supply voltage terminal, a base for receiving said first signal, and an emitter for providing said third signal;

first bias means coupled to said emitter of said first transistor, for providing a first predetermined current from said emitter of said first transistor to the second power supply voltage terminal when a second select signal is active;

a second transistor having a collector coupled to the first power supply voltage terminal, a base for receiving said second signal, and an emitter for providing said second output signal; and second bias means coupled to said emitter of said second transistor, for providing a second predetermined current to said emitter of said second transistor to the second power supply voltage terminal.

17. The output buffer of claim 11 wherein said feedback means comprises:

a first resistor having a first terminal coupled to said second power supply voltage terminal, and a second terminal;

a transistor having a first current electrode coupled to said second terminal of said resistor, a control electrode for receiving said data output signal, and a second current electrode for providing said third signal; and a second resistor having a first terminal coupled to said second current electrode of said transistor, and a second terminal coupled to said first power supply voltage terminal.

18. The output buffer of claim 17 wherein said feedback means further comprises:

a second transistor having a first current electrode for receiving said fourth signal, a control electrode for receiving said third signal, and a second current electrode; and a third resistor having a first terminal coupled to said second current electrode of said second transistor, and a second terminal coupled to said first power supply voltage terminal.

19. The output buffer of claim 11 wherein said pullup means comprises:

a first transistor having a first current electrode for receiving said reference voltage, a control electrode for receiving said third signal, and a second current electrode;

a second transistor having a first current electrode coupled to said second current electrode of said first transistor, a control electrode for receiving said third signal, and a second current electrode;

a third transistor having a first current electrode coupled to said second current electrode of said second transistor, a control electrode for receiving a second select signal, and a second current electrode coupled to said first power supply voltage terminal;

a fourth transistor having a first current electrode for receiving said reference voltage, a control electrode for receiving said select signal, and a second current electrode coupled to said second current electrode of said first transistor;

a fifth transistor having a first current electrode for receiving a second reference voltage, a control electrode coupled to said second current electrode of said first transistor, and a second current electrode for providing said fifth signal;

a sixth transistor having a first current electrode for receiving said third signal, a control electrode for receiving said reference voltage, and a second current electrode coupled to said second current electrode of said fifth transistor; and a seventh transistor having a first current electrode for receiving said third signal, a control electrode for receiving said second select signal, and a second current electrode coupled to said second current electrode of said fifth transistor.

20. An output buffer comprising:

input means for providing first and second signals respectively in response to positive and negative voltage differences between true and complementary input voltages, a logic high voltage of said first and second signals equal to a first predetermined voltage;

pullup means for providing a third signal in response to said first signal, a logic high voltage of said third signal equal to a second predetermined voltage;

a first transistor having a collector coupled to a first power supply voltage terminal, a base for receiving said first signal, and an emitter for providing a data output signal of the output buffer;

a second transistor having a collector coupled to said first power supply voltage terminal, a base for receiving said third signal, and an emitter;

a resistor having a first terminal coupled to said emitter of said second transistor, amd a second terminal coupled to said emitter of said first transistor; and a third transistor having a first current electrode coupled to said emitter of said first transistor, a control electrode for receiving said second signal, and a second current electrode coupled to a second power supply voltage terminal.

21. The output buffer of claim 20 further comprising a fourth transistor having both a base and a collector coupled to said base of said first transistor, and an emitter coupled to said emitter of said first transistor.

22. The output buffer of claim 21 further comprising:

a second resistor having a first terminal coupled to said first power supply voltage terminal, and a second terminal;

a fifth transistor having a first current electrode coupled to said second terminal of said second resistor, a control electrode for receiving said data output signal, and a second current electrode for providing said first signal; and a third resistor having a first terminal coupled to said second current electrode of said fifth transistor, and a second terminal coupled to said second power supply voltage terminal.

* * * * *

UNITED STATES PATENT AND TRADEMARK OFFICE
CERTIFICATE OF CORRECTION

PATENT NO. : 5,140,191

DATED : August 18, 1992

INVENTOR(S) : Scott G. Nogle

It is certified that error appears in the above-identified patent and that said Letters Patent is hereby corrected as shown below:

Column 31, line 48, change "electrodes", to --electrode--.

Signed and Sealed this

Second Day of November, 1993

Attest:

BRUCE LEHMAN

Attesting Officer    Commissioner of Patents and Trademarks